US012615908B2

(12) United States Patent
Liu et al.

(10) Patent No.: US 12,615,908 B2
(45) Date of Patent: Apr. 28, 2026

(54) WIDE BANDGAP PEROVSKITE QUANTUM DOTS IN A PEROVSKITE MATRIX AND PROCESS FOR PREPARING SAME

(71) Applicants: HUAWEI TECHNOLOGIES CANADA CO., LTD., Kanata (CA); The Governing Council of the University of Toronto, Toronto (CA)

(72) Inventors: Yuan Liu, Toronto (CA); Giovanni Francesco Cotella, Ipswich (GB); Quan Lyu, Ipswich (GB); Peter Chun, Kanata (CA); Ziliang Li, Toronto (CA); Yitong Dong, Toronto (CA); Edward Sargent, Toronto (CA)

(73) Assignees: HUAWEI TECHNOLOGIES CANADA CO., LTD., Kanata (CA); The Governing Council of the University of Toronto, Toronto (CA)

( * ) Notice: Subject to any disclaimer, the term of this patent is extended or adjusted under 35 U.S.C. 154(b) by 1079 days.

(21) Appl. No.: 17/532,543

(22) Filed: Nov. 22, 2021

(65) Prior Publication Data

US 2023/0165129 A1 May 25, 2023

(51) Int. Cl.

| | |
|---|---|
| *H10K 50/115* | (2023.01) |
| *C07F 7/24* | (2006.01) |
| *C07F 9/53* | (2006.01) |
| *C09K 11/02* | (2006.01) |
| *C09K 11/06* | (2006.01) |
| *C09K 11/66* | (2006.01) |
| *H10K 50/11* | (2023.01) |
| *H10K 71/12* | (2023.01) |
| *H10K 85/10* | (2023.01) |
| *H10K 85/50* | (2023.01) |

(52) U.S. Cl.
CPC .............. *H10K 50/115* (2023.02); *C07F 7/24* (2013.01); *C09K 11/02* (2013.01); *C09K 11/025* (2013.01); *C09K 11/06* (2013.01); *C09K 11/664* (2013.01); *C09K 11/665* (2013.01); *H10K 85/50* (2023.02); *C07F 9/5325* (2013.01); *H10K 50/11* (2023.02); *H10K 71/12* (2023.02); *H10K 85/1135* (2023.02)

(58) Field of Classification Search
CPC .... C07F 7/2204; C07F 7/2208; C07F 7/2284; C07F 7/24
See application file for complete search history.

(56) References Cited

U.S. PATENT DOCUMENTS

| | | | |
|---|---|---|---|
| 2016/0380136 A1 | 12/2016 | Ning et al. | |
| 2017/0121598 A1 | 5/2017 | Min et al. | |
| 2017/0358757 A1 | 12/2017 | Lee et al. | |

(Continued)

FOREIGN PATENT DOCUMENTS

| | | | | |
|---|---|---|---|---|
| CN | 109370577 A | * | 2/2019 | ........... C09K 11/665 |
| WO | 2018113983 A1 | | 6/2018 | |

OTHER PUBLICATIONS

Pang et al., machine translation of CN-109370577-A (2019) pp. 1-6. (Year: 2019).*

(Continued)

*Primary Examiner* — Dylan C Kershner

(57) ABSTRACT

The present invention provides quantum dot (QD)-in-matrix materials for use in blue light emitting diodes, wherein the QD-in-matrix material comprises a plurality of quantum dots embedded in a doped lead perovskite matrix.

12 Claims, 25 Drawing Sheets

Perovskite matrix (higher Eg)

Perovskite QDs (lower Eg)

(56)            References Cited

U.S. PATENT DOCUMENTS

| 2018/0090312 A1 | 3/2018 | Pickett et al. |
| 2020/0052154 A1 | 2/2020 | Zhang |

OTHER PUBLICATIONS

Li et al., "Efficient defect-passivation and charge-transfer with interfacial organophosphorus ligand modification for enhanced performance of perovskite solar cells", Solar Energy Materials and Solar Cells, vol. 211, (2020) 110527, pp. 1-10. (Year: 2020).*

Zhao et al., "Divalent hard Lewis acid doped CsPbBr3 films for 9.63%-efficiency and ultra-stable all-inorganic perovskite solar cells", Journal of Materials Chemistry A, (2019), vol. 7, pp. 6877-6882. (Year: 2019).*

Ning, Z.; Gong, X.; Comin, R.; Walters, G.; Fan, F.; Voznyy, O.; Yassitepe, E.; Buin, A.; Hoogland, S.; Sargent, E. H. Quantum-Dot-in-Perovskite Solids. Nature 2015, 523 (7560), 324-328.

Protesescu, L.; Yakunin, S.; Bodnarchuk, M. I.; Krieg, F.; Caputo, R.; Hendon, C. H.; Yang, R. X.; Walsh, A.; Kovalenko, M. V. Nanocrystals of Cesium Lead Halide Perovskites (CsPbX3, X = Cl, Br, and I): Novel Optoelectronic Materials Showing Bright Emission with Wide Color Gamut. Nano Lett. 2015, 15 (6), 3692-3696.

Dong, Y.; Wang, Y.-K.; Yuan, F.; Johnston, A.; Liu, Y.; Ma, D.; Choi, M.-J.; Chen, B.; Chekini, M.; Baek, S.-W.; Sagar, L. K.; Fan, J.; Hou, Y.; Wu, M.; Lee, S.; Sun, B.; Hoogland, S.; Quintero-Bermudez, R.; Ebe, H.; Todorovic, P.; Dinic, F.; Li, P.; Kung, H. T.; Saidaminov, M. I.; Kumacheva, E.; Spiecker, E.; Liao, L.-S.; Voznyy, O.; Lu, Z.-H.; Sargent, E. H. Bipolar-Shell Resurfacing for Blue LEDs Based on Strongly Confined Perovskite Quantum Dots. Nat. Nanotechnol. 2020, 15 (8), 668-674.

Cai, L.; Liang, D.; Wang, X.; Zang, J.; Bai, G.; Hong, Z.; Zou, Y.; Song, T.; Sun, B. Efficient and Bright Pure-Blue All-Inorganic Perovskite Light-Emitting Diodes from an Ecofriendly Alloy. J. Phys. Chem. Lett. 2021, 12, 1747-1753.

Dong, Y.; Qiao, T.; Kim, D.; Parobek, D.; Rossi, D.; Son, D. H. Precise Control of Quantum Confinement in Cesium Lead Halide Perovskite Quantum Dots via Thermodynamic Equilibrium. Nano Lett. 2018, 18 (6), 3716-3722.

* cited by examiner

Perovskite QDs
(lower Eg)

Perovskite matrix
(higher Eg)

matrix

QDs

Emission from QDs only
(PLQY > 50%)

WIDE BANDGAP PEROVSKITE QUANTUM DOTS IN A PEROVSKITE MATRIX AND PROCESS FOR PREPARING SAME

FIELD OF THE INVENTION

The present invention pertains to the field of optoelectronics, and in particular to electroluminescent materials.

BACKGROUND

Metal halide perovskites have been shown to be promising emitters for light-emitting diodes (LEDs) owing to their tunable emission wavelength, superior color purity and excellent electroluminescence (EL) efficiency.

Light-emitting perovskite quantum dots (QDs) have shown high photoluminescent quantum yield (PLQY>90%) and, when embedded in electroluminescent devices, high external quantum efficiency (EQE>10%). However, the charge carriers in QDs can become trapped at surface defect sites, compromising luminescence efficiency as well as the material's stability. As such, devices that include such perovskite QD solids can have good performance but their lifetime is generally poor.

Alternatively, epitaxial growth of a perovskite matrix onto quantum dots (QDs) can enable efficient near-infrared LEDs, as it unites efficient charge transport with strong surface passivation. Incorporation of QDs into a lead halide perovskite ($APbX_3$) matrix has been shown to enable efficient charge transport and surface passivation, leading to efficient and stable optoelectronics (Refs. 1-3).

Quantum confinement and composition engineering in perovskite enable broad $E_g$ tunability (Refs 4,5). Strongly-confined $CsPbBr_3$ QDs enable <495 nm emission (Ref 6) and avoid halide segregation (Ref 7). However, a QD-in-matrix structure has been difficult to achieve for green and blue LEDs due to the absence of a perovskite matrix with a suitable band gap energy ($E_g$). In such a structure, charge transport requires a type-I band alignment between the QDs and the matrix, mandating a matrix with a $E_g$ that is larger than that of the QDs.

There is therefore a need for the development of stable and efficient electroluminescent materials suitable for use in blue and green light emitting diodes.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a wide bandgap perovskite quantum dots in a perovskite matrix and process for preparing same. In accordance with an aspect of the present invention, there is provided a quantum dot (QD)-in-matrix material for use in blue light emitting diodes, wherein the QD-in-matrix material comprises a plurality of quantum dots embedded in a perovskite matrix, wherein the quantum dots comprise a perovskite having Formula (I):

$$ABX_3 \tag{I}$$

wherein A is Cs, MA (methylammonium), FA (formamidinium), or any combination thereof; B is Pb, Sn, or a combination thereof; and X is Br, Cl, or a combination thereof; and wherein the perovskite matrix is a doped perovskite having Formula (II):

$$A'B'_{1-x}D_xX'_3 \tag{II}$$

wherein A' is Cs, MA, FA, or any combination thereof; B' is Pb, Sn, or a combination thereof; X' is Br; D is Sr, Ca, Ba, Eu, Zn, Cd, Hf, Ti, Se, Zr, or Mn; and x is a value between 0.05 and 0.5.

In accordance with another aspect of the present invention, there is provided an electroluminescent device comprising a QD-in-matrix material of the present invention.

In accordance with another aspect of the present invention, there is provided a process for preparing a quantum dot (QD)-in-matrix material comprising a plurality of quantum dots embedded in a perovskite matrix, wherein the quantum dots have the formula $ABX_3$ and the perovskite matrix has the formula $A'B'_{1-x}D_xX'_3$, the process comprising the steps of: providing a dispersion of said quantum dots in a solution comprising a passivant in toluene; providing a matrix precursor solution comprising A'X, $B'X_2$ and $DX_2$ in DMSO; applying the matrix precursor solution on a substrate to form a matrix layer; applying the quantum dot dispersion on the substrate by dripping the dispersion during the application of the matrix precursor solution, to provide a film comprising the quantum dots and the matrix precursor solution; heating the resulting film at about 50° C. (for about 30 seconds) to initiate crystallization of the perovskite matrix on the quantum dots; and annealing the resulting crystalline mixture at a temperature of about 100° C. to provide the QD-in-matrix material. In embodiments, the matrix precursor solution is applied by a solution processing method such as spin-casting, ink-jet printing or slot-die coating.

DETAILED DESCRIPTION OF THE INVENTION

Unless defined otherwise, all technical and scientific terms used herein have the same meaning as commonly understood by one of ordinary skill in the art to which this invention belongs.

The terms "quantum dot", "dot" and "QD" are used interchangeably throughout the present disclosure.

As used herein, the term "about" refers to a +/−10% variation from the nominal value. It is to be understood that such a variation is always included in a given value provided herein, whether or not it is specifically referred to.

The present invention provides a novel material comprising perovskite quantum dots (QDs) embedded in a doped perovskite matrix that provide stable and efficient blue and green light emitting materials. The QD-in-matrix materials of the present invention are particularly suitable for incorporation into blue and green LEDs.

Efficient charge transport in such a matrix/QD structure requires a type-I energy band alignment between the perovskite matrix and the embedded perovskite QDs, mandating a matrix with $E_g$ larger than that of the dots. The energy differences between the bands allow efficient charge transport from matrix to QD. With a matrix having a band gap energy $E_g$ above 2.7 eV, a type I heterojunction between a perovskite matrix and embedded perovskite QDs allows the QDs to emit optical wavelengths corresponding to a range of colors from sky-blue to green. The present invention has shown that embedding such wide-$E_g$ perovskite QDs into a suitable perovskite matrix thus offers a route toward blue LEDs. The present invention allows tuning of the band gap via the use of different A-site and B-site cation alloys in the matrix selected with the goal of modulating $E_g$ of the resulting perovskite materials. Accordingly, in one embodiment, the present invention has found that, by doping the matrix with different cation dopants, the band gap energy can be enlarged.

Using the methods of the present invention, the bandgap of QD (by increasing or decreasing confinement) were tuned to see how the energy differences affect the device performance. As a result, it was found that the device performance reduces with the decreasing energy difference.

The emission wavelength can be tuned by applying different quantum confinement to QDs. By reducing the size of QDs, more quantum confinement is applied to QDs and therefore the bandgap is increased, resulting in a blue-shifted emission wavelength. Accordingly, in one embodiment, the QDs were synthesized under different temperature to tune the size of QDs: the higher the temperature, the larger the QDs.

The present invention therefore provides wide-$E_g$ QD-in-perovskite matrix materials that enable high luminescence efficiency and spectral stability. These materials were identified through the screening of alloy candidates that modulate the perovskite $E_g$ and allow heteroepitaxy, allowing implementation of both type-I band alignment and lattice matching.

Figures 1, 2:
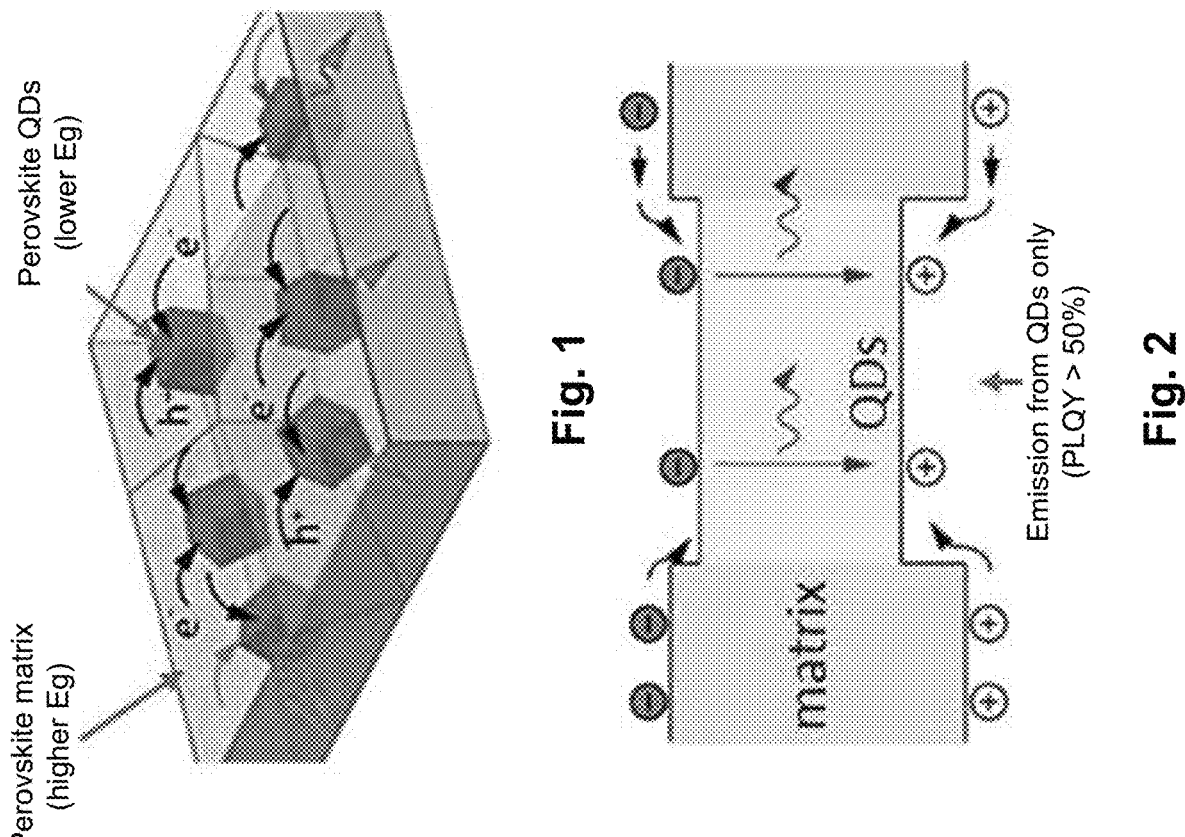
FIG. 1 is a schematic depiction of a QD-in-matrix material, in accordance with one embodiment of the present invention.
FIG. 2 is a schematic depiction of the energy level alignment between a QD and the surrounding matrix in a QD-in-matrix material, in accordance with one embodiment of the present invention.

FIG. 1 is a schematic depiction of a QD-in-matrix material. FIG. 2 is a schematic depiction of the energy level alignment between a QD and the surrounding matrix in a QD-in-matrix material. Charges flow from the high energy level matrix to the low energy level QD to get recombined, resulting in emission of light at the QD.

Embodiments of the QD-in-matrix materials of the present invention incorporate strongly-confined quantum dots (QDs) made of a perovskite structure that enable the emission of optical wavelengths of less than 495 nm. By coating a layer of such QDs with a matrix having a matched perovskite structure, stable and efficient blue LEDs have been developed.

In one embodiment of the present invention, the QD-in-matrix material comprises a plurality of quantum dots embedded in a perovskite matrix, wherein the quantum dots comprise a perovskite having Formula (I):

$$ABX_3 \tag{I}$$

wherein A is Cs, MA (methylammonium), FA (formamidinium), or any combination thereof; B is Pb, Sn or a combination thereof; and X is Br, Cl, or a combination thereof; and wherein the perovskite matrix is a doped perovskite having Formula (II):

$$A'B'_{1-x}D_xX'_3 \qquad \text{(II)}$$

wherein A' is Cs, MA, FA, or any combination thereof; B' is Pb, Sn, or combination thereof; X' is Br, D is Sr, Ca, Ba, Eu, Zn, Cd, Hf, Ti, Se, Zr or Mn, and x is a value between 0.05 and 0.5.

The respective components of the QDs of Formula (I) and the matrix of Formula (II) can be selected to provide QD-in-matrix materials exhibiting the desired optical properties. In one embodiment, the A and B cations of the QDs are the same as the A' and B' of the matrix. In one embodiment, the A and B cations of the QDs are not the same as the A' and B' of the matrix.

In a preferred embodiment, the QD is a lead halide perovskite and the matrix is a doped lead halide perovskite.

In order to achieve a type-I band alignment between the matrix-shell and embedded QDs, a series of cation alloys that enlarges the bandgap were screened.

With the goal of modulating $E_g$ of the perovskite, the following doping cations were considered to be candidates: $Sr^{2+}$, $Al^{3+}$, $Zn^{2+}$, $Rb^+$, $Mn^{2+}$, $Ni^{2+}$, $Nd^{2+}$, $Yb^{3+}$, $Ca^{2+}$, $Eu^{2+}$, $Ag^+$, $Bi^{3+}$, $Cd^{2+}$, $Hf^{4+}$, $Ti^{4+}$, $Se^{4+}$, $Zr^{4+}$ and $Mg^{2+}$ (Refs 15, 25-33).

Figure 4:
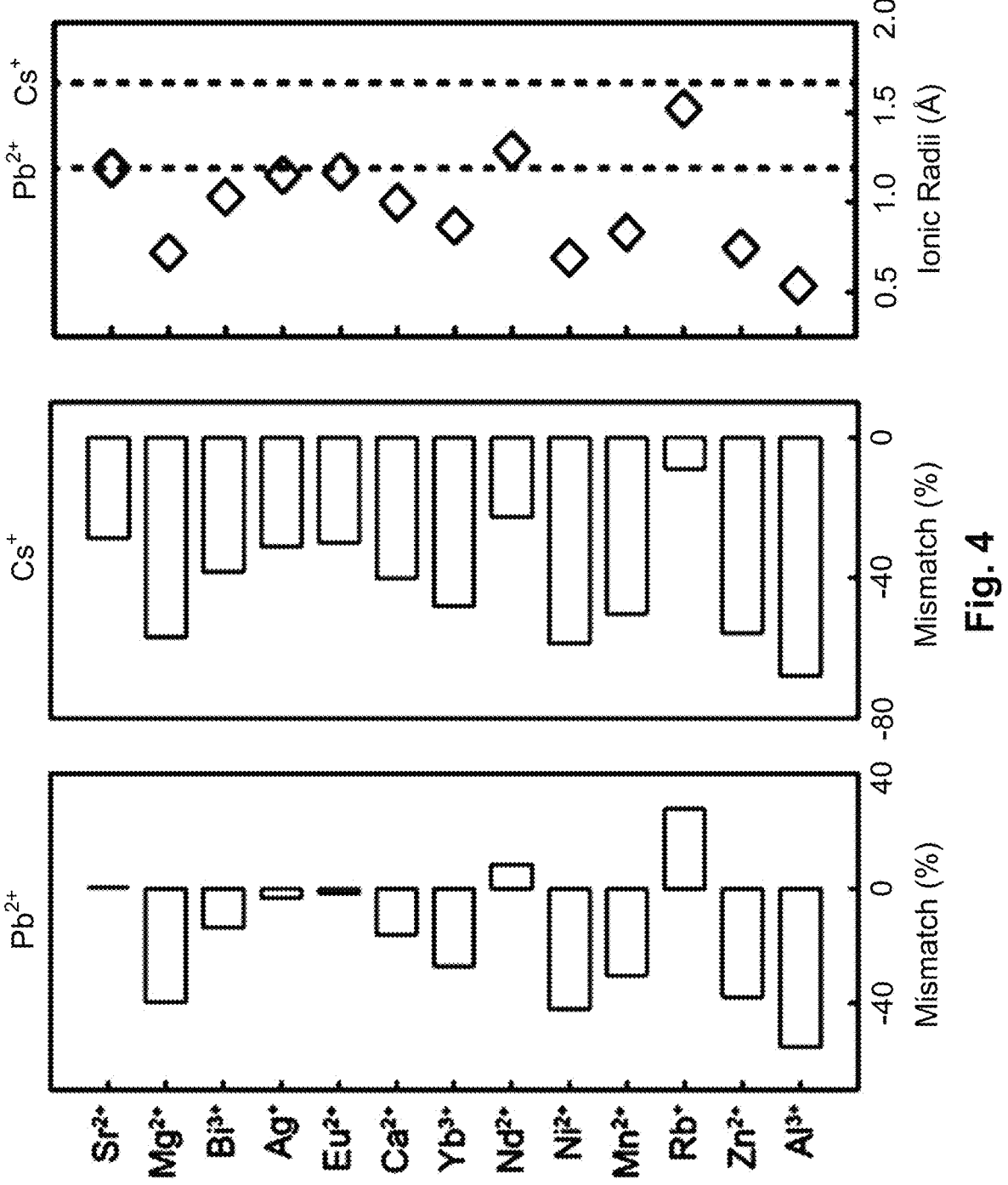
FIG. 4 depicts a comparison of A-site and B-site alloy candidates with $Pb^{2+}$ and $Cs^+$ in size differences.

The initial focus was on $Sr^{2+}$ due to its close match in ionic radius with that of $Pb^{2+}$ and $Cs^+$, in view of the goal of minimizing lattice mismatch. FIG. 4 depicts a comparison of A-site and B-site alloy candidates with $Pb^{2+}$ and $Cs^+$ in size differences. Mismatch (%) here is estimated by $[r(M)-r(Pb)]/r(Pb)*100\%$ (r: ionic radii of cation $M^{x+}$). In one embodiment, a suitable candidate doping cation is one which has a calculated % mismatch relative to the B-site cation of less than about 5%. In a preferred embodiment, the doping cation has a calculated % mismatch relative to the B-site cation of less than about 9%.

In one embodiment, the QDs comprise a lead halide perovskite of Formula (I), wherein A is Cs, B is Pb, and X is Br.

In one embodiment, the perovskite matrix is a doped lead halide perovskite of Formula (II), wherein A' is Cs, B' is Pb, D is Sr, and X is Br.

In a preferred embodiment, the QD-in-matrix material comprises quantum dots of the formula $CsPbBr_3$ embedded in a perovskite matrix of the formula $CsPb_{1-x}Sr_xBr_3$, wherein x is 0.2 to 0.4.

In one embodiment, the perovskite matrix is a doped lead halide perovskite of Formula (II), wherein A' is a combination of Cs and MA, B' is Pb, D is Sr, and X is Br.

In a preferred embodiment, the QD-in-matrix material comprises quantum dots of the formula $CsPbBr_3$ embedded in a perovskite matrix of the formula $Cs_{1-y}MA_yPb_{1-x}Sr_xBr_3$, wherein y is 0 to 1 and x is 0.2 to 0.4.

The present invention also provides a process for preparing the QD-in-matrix material comprising quantum dots embedded in the perovskite matrix, wherein the quantum dots have the formula $ABX_3$ and the perovskite matrix has the formula $A'B'_{1-x}D_xX'_3$. In one embodiment, the process comprises the steps of:

providing a dispersion of said quantum dots in a solution comprising a passivant in toluene;
  providing a matrix precursor solution comprising A'X', $B'X'_2$ and $DX'_2$ or $DX'_4$ in DMSO;
  applying the matrix precursor solution on a substrate, wherein the matrix precursor solution is applied to form a matrix layer;
  applying the quantum dot dispersion on the substrate by dripping the dispersion during the application of the matrix precursor solution, to provide a film comprising the quantum dots and the matrix precursor solution;
  heating the resulting film at about 50° C. (for about 30 seconds) to initiate crystallization of the perovskite matrix on the quantum dots; and
  annealing the resulting crystalline mixture at a temperature of about 100° C. to provide the QD-in-matrix material.

In one embodiment, the matrix precursor solution is applied by a solution processing method such as spin-casting, ink-jet printing or slot-die coating. In a preferred embodiment, the matrix precursor solution is applied by s[pin-casting.

In one embodiment of the process, A is Cs, MA, FA, or any combination thereof; B is Pb, Sn, or a combination thereof; X is Br, Cl, or a combination thereof; A' is Cs, MA, FA, or any combination thereof; B' is Pb, Sn, or a combination thereof; D is Sr, Ca, Ba, Eu, Zn, Cd, Mn, Hf, Ti, Se, or Zr; and X is Br.

In a preferred embodiment of the process, A'X is CsBr and MABr in a ratio of 4:1 to 2:1; $B'X_2$ is $PbBr_2$; $DX_2$ is $SrBr_2$; and the ratio of $B'X_2$ to $DX_2$ is 3:2.

In another preferred embodiment of the process, A'X is CsBr; $B'X_2$ is $PbBr_2$; $DX_2$ is $SrBr_2$; and the ratio of $B'X_2$ to $DX_2$ is 3:2.

In one embodiment, the passivant is bis(4-fluorophenyl)phenylphosphine oxide, triphenylphosphine oxide, or tris(4-fluorophenyl)phosphine oxide. In a preferred embodiment, the passivant is bis(4-fluorophenyl)phenylphosphine oxide.

In one embodiment, the substrate is ITO coated glass, and the ITO coated glass is further coated with PEDOT:PSS:PFI (Poly(3,4-ethylenedioxythiophene):poly(styrenesulfonate: perfluorinated ionomer).

In an exemplary embodiment, it has been shown that if the perovskite matrix is doped with Sr substituted at Pb sites, a band gap energy ($E_g$) of over 2.7 eV can be achieved, which is sufficient to cause the embedded perovskite QDs to emit blue and green optical wavelengths.

In those embodiments of the perovskite matrix wherein D is selected from $Hf^{4+}$, $Ti^{4+}$, $Se^{4+}$ or $Zr^{4+}$, it is preferred that x<0.1.

Figure 5:
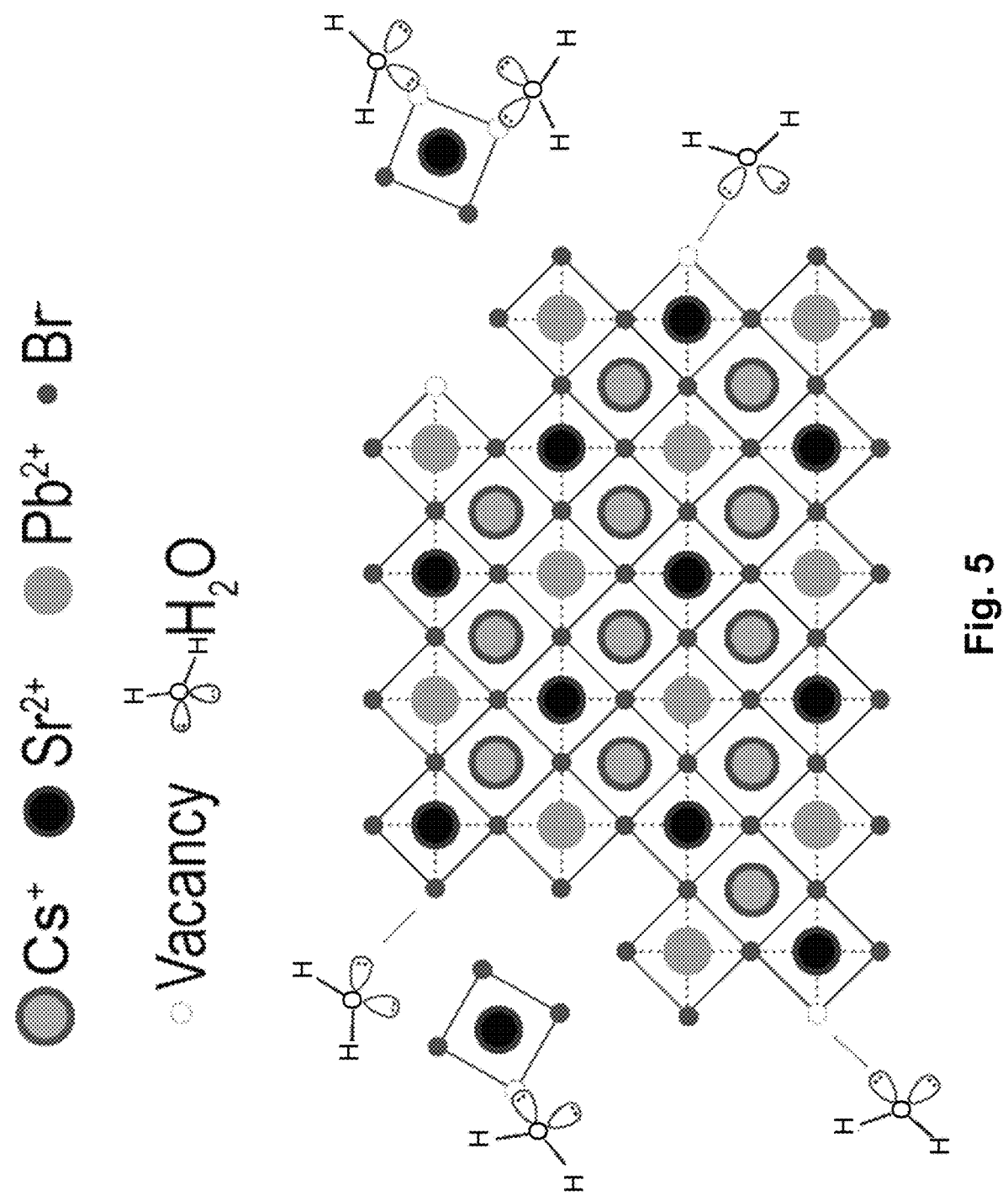
FIG. 5 is a schematic depiction of the dissolution of $Sr^{2+}$ as a result of $H_2O$ coordination.

For matrix embodiments doped with $Sr^{2+}$, decomposition of the matrix material was observed. $Sr^{2+}$ alloyed perovskite is indeed expected to be hygroscopic, prone to form $Sr(H_2O)_x^{2+}$ in the presence of moisture (Refs 18, 19). $[SrBr_6]^{4-}$ octahedron reacts with $H_2O$ and the $Sr^{2+}$ is extracted from the lattice to form $Sr(H_2O)_x^{2+}$. FIG. 5 is a schematic depiction of the dissolution of $Sr^{2+}$ as a result of $H_2O$ coordination. Since $Sr^{2+}$ is hygroscopic, in one embodiment, a passivating material is incorporated into the QD-in-matrix material to avoid decomposition of the matrix material by moisture.

Accordingly, in one embodiment, the QD-in-matrix material further comprises an organic passivant.

In one embodiment, an organic passivant comprising a Lewis base component (e.g., S=O, P=O, P=S) (Refs 35, 36) to donate electrons, in combination with large functional group (e.g., phenyl), is incorporated into the materials of the present invention to prevent decomposition of the materials by moisture. Without intending to be bound by theory, it is believed that the Lewis base component coordinates with the $Sr^{2+}$ (or other electron pair accepting) sites on the matrix surface, and the large functional groups offer steric hindrance to block the incursion of $H_2O$ to the hygroscopic sites on the surface of the matrix (Ref 21). To avoid decomposition of this matrix material by moisture, molecules that coordinate with $Sr^{2+}$ and offer steric hindrance were screened.

In one embodiment, the organic passivant is an organic molecule having Formula (III):

$$R_3W \qquad \qquad (III)$$

wherein W is selected from S=O, P=O and P=S, and each R is independently a hydrophobic organic group optionally substituted with one or more substituents selected from halo, hydroxyl, $C_1$-$C_6$alkyl, $C_1$-$C_6$hydroxyalkyl, and $C_1$-$C_6$haloalkyl.

In one embodiment, the hydrophobic organic group is selected from the group consisting of an aromatic group, a heteroaromatic group, and a lactone. In one embodiment, each R is independently a phenyl optionally substituted with one or more substituents selected from halo, $C_1$-$C_6$alkyl, $C_1$-$C_6$hydroxyalkyl, and $C_1$-$C_6$haloalkyl. In one embodiment, the passivant is selected from bis(4-fluorophenyl) phenylphosphine oxide, triphenylphosphine oxide, and tris (4-fluorophenyl)phosphine oxide.

Figure 9:
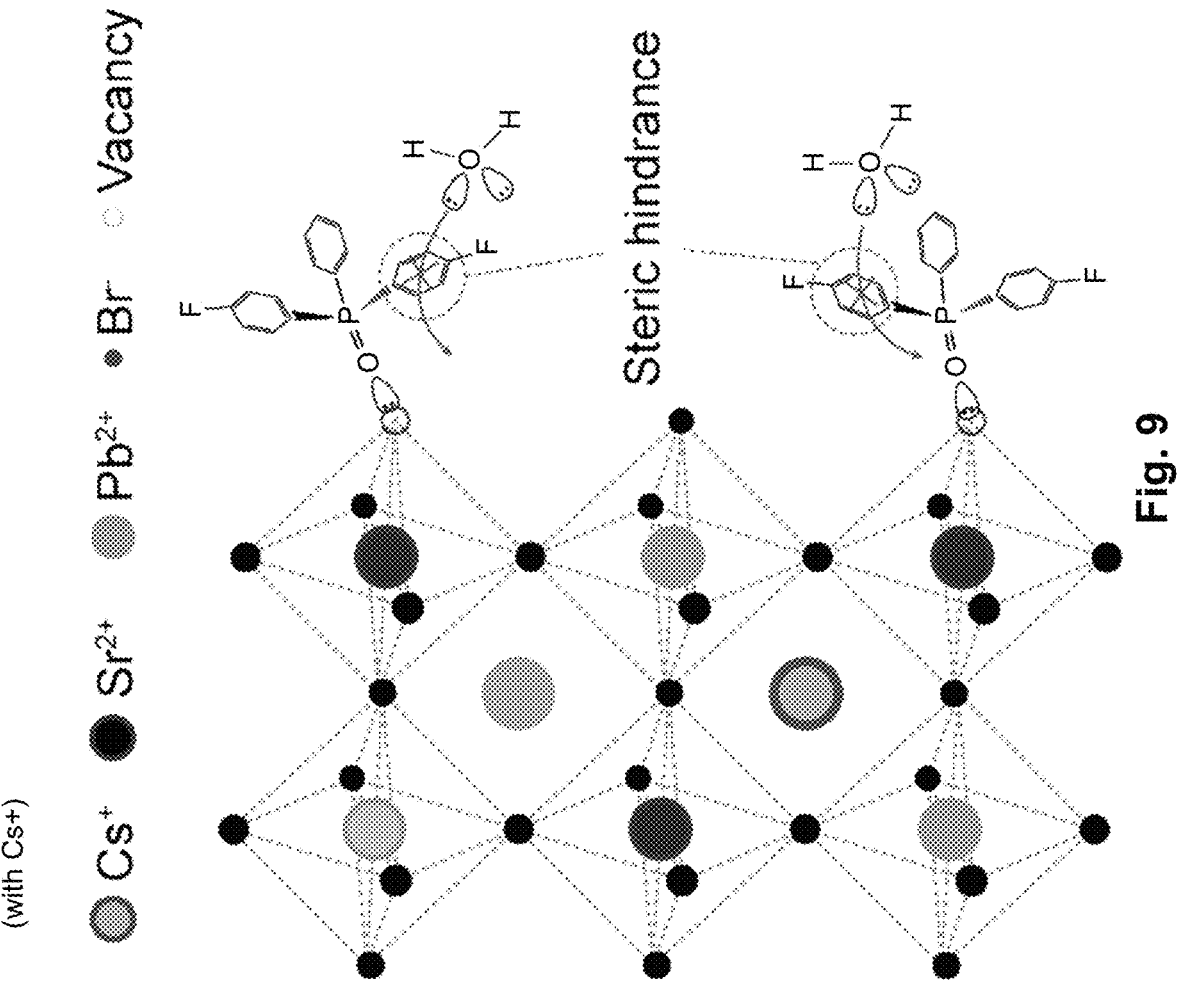
FIG. 9 is a schematic depiction of DFPPO passivation to prevent $H_2O$ coordination with $Sr^{2+}$, in accordance with one embodiment of the present invention.

In a preferred embodiment, the passivant is bis(4-fluorophenyl)phenyl phosphine oxide (DFPPO), a ligand that contains electron-donating phosphine oxides ($R_3P$=O) (Ref 35) and large functional groups (R=–4-fluorophenyl and -phenyl groups). FIG. 9 is a schematic depiction of passivation using DFPPO to prevent $H_2O$ coordination with $Sr^{2+}$ in the matrix.

The passivant bis(4-fluorophenyl)phenyl phosphine oxide, selected based on the above-mentioned principles, demonstrated a positive effect on preventing the decomposition of the mixed Sr/Pb perovskite matrix in air.

Accordingly, in a preferred embodiment, the QD-in-matrix materials comprise a combination of a $CsPbBr_3$ perovskite QD and a $Cs_{1-y}MA_yPb_{1-x}Sr_xBr_3$ matrix, wherein y is 0 to 1 and x is 0.2 to 0.4, passivated with DFPPO, demonstrating that alloying with $Sr^{2+}$ increases the $E_g$ of the perovskite matrix to >2.7 eV while also minimizing lattice mismatch between the matrix and QDs The resultant QD-in-matrix materials according to this embodiment exhibit efficient charge transport from the matrix to the QDs and efficient and stable blue light emission. These materials were used to construct an LED having an external quantum efficiency (EQE) of about 11% to about 14%, a luminance exceeding 6,000 cd m$^{-2}$.

The materials of the present invention also do not suffer from the deleterious effects observed using other methods of increasing the band gap energy of the matrix material, namely use of a mixture of bromine and chlorine (Cl). By mixing in over 30% of Cl, the band gap energy $E_g$ of a $CsPbBr_3$-based perovskite matrix can be tuned to more than 2.6 eV. However, reliance on a high content of Cl can produce segregation of a Cl-rich perovskite phase. Although mixing >30% Cl was observed to tune the $E_g$ of $CsPbBr_3$-based perovskites to greater than 2.6 eV (Ref 8,9), reliance on high Cl content produces segregation of a Cl-rich perovskite phase (Ref 9). The lattice mismatch between mixed Cl/Br perovskite (for instance, 5.77 Å for 40% Cl and 5.80 Å for 30% Cl (Ref 10)) and $CsPbBr_3$ QDs (5.87 Å (Ref 11)) makes these materials vulnerable to inhomogeneous crystallization due to the growth of the $[PbBr_6]^{4-}$ octahedron epitaxially onto $CsPbBr_3$ QDs (Refs 2, 12-14).

As demonstrated herein, the present invention overcomes these deficiencies through varying the cation in the perovskite matrix, thereby increasing $E_g$ to the required $E_g$>2.7 eV while still lattice matching to the dots.

The invention will now be described with reference to specific examples. It will be understood that the following examples are intended to describe embodiments of the invention and are not intended to limit the invention in any way.

EXAMPLES

General Methods

LED performance and stability measurement. The J-V characteristics of LEDs were recorded by a Keithley 647 source meter. EL spectra and luminance at a certain J-V point were measured by a calibrated fiber coupled spectrometer (QE-pro, Ocean Optics) and an integrating sphere.

Transient absorption (TA) measurements. TA spectra were collected using a femtosecond (fs) pump-probe spectroscopy system. The fs laser pulses were produced by a regeneratively amplified Yb:KGW laser (Light Conversion, Pharos) at a 1 kHz repetition rate. The pump pulse was generated by passing through an optical parametric amplifier (OPA, Light Con-version Orpheus) and chopped, while the other portion of the fundamental beam was directed onto a sapphire crystal after focusing to generate white-light supercontinuum as the probe light. The power of pump light was measured using a power meter (Ophir) to ensure excitation fluence is below the Auger threshold. The time delay of the probe pulses was optically controlled by a translation stage. The probe light spectra were collected with a CCD detector. TA bleach recovery dynamics were recorded at the band edge bleach peak position.

X-ray diffraction measurement. XRD patterns were obtained by a benchtop X-ray diffractometer (Miniflex, Rigaku). For QD powder preparation, QDs were purified twice by methyl acetate and eventually dissolved in 1.5 mL of toluene. QD solution was then deposited onto a substrate dropwise until fully dried.

Steady-state and time-resolved (in-situ) PL measurement: PL spectra and PLQY were measured and calculated by a Horiba Fluorolog system coupled with a xenon lamp. High power excited, time-resolved PL intensity tracking was conducted by using a CW laser (442 nm) and a fibre-coupled spectrometer (QE-pro, Ocean Optics) under ambient condition. In-situ PL measurement was conducted in a nitrogen-filled glovebox using a homemade setup consist of a spectrometer (QE-pro, Ocean Optics), a UV lamp (380 nm) and a spinner. PL spectra were continuously collected by a compatible software (OceanView) during spin-casting.

TEM measurement. Samples for TEM imaging were prepared by using the same spin-coating and annealing method above with a copper TEM grid. TEM was performed using a Hitachi HF-3300 S/TEM, operated at 300 kV.

NMR measurement. Samples for NMR measurement were prepared by dissolving DFPPO (10 mg/mL) alone and with $SrBr_2$ (10 mg/mL) in DMSO-$D_6$. 1D 19F NMR (19F; 470.30 MHz), and 1D 31P NMR (31P; 202.35 MHz) spectra were acquired at 25° C. using a 500 MHz Agilent DD2 spectrometer equipped with a 5 mm 1H-19F{X} OneNMR probe. The spectra were acquired using the standard phosphorus pulse sequence as supplied by the Varian/Agilent acquisition software.

Example 1: $CsPbBr_3$ QD Synthesis and Purification

Quantum confined size-tunable $CsPbBr_3$ QDs were synthesized and purified following a previously reported method (Ref 39). Cs-precursors were prepared by loading 300 mg $Cs_2CO_3$, 1.2 mL oleic acid (OAc), and 3.2 mL 1-octadecene (ODE) in a three-necked round bottom flask under nitrogen. Then the Cs-precursors were dried at room temperature for 10 min and dissolved in DMSO at 150° C. under $N_2$ atmosphere. The solution was kept under 120° C. before use.

For 480 nm QDs, 600 mg $PbBr_2$, and 1400 mg $ZnBr_2$ were loaded in a 250 mL flask together with 14 mL OAc, 14 mL oleylamine (OAm), and 40 mL ODE. The solution was subsequently stirred and dried under 100° C. until no residual could be found. Then the solution was slowly cooled down under $N_2$ until 80° C. when 2.7 mL of the Cs-precursor was swiftly injected. The solution was kept at 80° C. for 3 min to complete reaction and quenched by ice bath. The obtained solution was centrifuged and kept at room temperature for 24 hours before purification. The stilled solution was centrifuged again, and the supernatant was kept for purification.

The nanoparticles were obtained by adding acetone with a volume ratio of 1:1 to the solution, followed by centrifugation at 7800 rpm for 3 min. All the particles were redissolved in 7 mL of toluene and stored in the refrigerator.

Synthesis and purification of 485 nm and 490 nm QD follow a similar procedure, where 700 mg $PbBr_2$ were loaded in the precursor solution instead. The injection temperatures are 85° C. and 100° C. for 485 nm and 490 nm QD, respectively.

Example 2: CsPbBr$_3$ QD Ligand Exchange

CsPbBr$_3$ QD ligand exchange follows a previously reported method (Ref 11). The QD solution was stored in refrigerator for over 24 h before use and was centrifuged again before ligand exchange. Then the QDs were precipitated by 20 mL methyl acetate and redissolved in 5 mL toluene. Then ~120 μL of 200 mg/mL IPABr (isopropylammonium bromide) DMF solution was added to the mixture. The solution was vortexed for 1 min and centrifuged at 7800 rpm for 1 min to remove exchanged and excessive ligands. The QDs were precipitated again by 20 mL methyl acetate and redissolved in 5 mL toluene.

To keep a bromine rich surface for matrix-perovskite shelling, ~80 μL of NaBr saturated DMF solution was added for additional exchange. QD was purified again following above-mentioned steps. The final QD precipitants were dissolved in 1.5 mL DFPPO-toluene solution (10 mg/mL) followed by centrifuging at 15,000 rpm. The exchanged QDs were immediately used for making QD-in-matrix solid.

The final concentration of QD was estimated by measuring the optical density of the solution at 400 nm using previously reported data of CsPbBr$_3$ QD cross sections (Ref 40)). The final QD concentration was around 38-43 μM.

Example 3: Preparation of Mixed Sr/Pb Reduced Dimensional Perovskite Precursor Reduced dimensional perovskite matrix precursor solutions were prepared by dissolving $PbBr_2$, $SrBr_2$, MABr, CsBr, and PEABr (phenylethylammonium bromide) in DMSO with a Pb concentration of 0.4 M. In detail, for 40% Sr and n=3 matrix-shell, 0.36 mmol of $PbBr_2$, 0.24 mmol of $SrBr_2$, 0.32 mmol of CsBr, 0.13 mmol of MABr, and 0.4 mmol of PEABr were mixed and dissolved in 2 mL DMSO in nitrogen-filled glovebox with continuous stirring for over 120 min.

Example 4: Fabrication of QD-In-Matrix Solid and LEDs

120 μL of matrix precursor solution were spin-casted by a two-step process at 1000 rpm for 10 s and 5000 rpm for 30 s, sequentially. 150 μL QD solution was dripped on the precursor solution at 25 s of the second step of spin-casting to obtain a QD dispersed saturated precursor solution films. The films were kept initially at 50° C. for ~30 s for controlled crystallization and annealed at 100° C. for another 5 mins. For matrix only films, antisolvent (toluene herein) containing 10 mg/mL DFPPO was used instead of QD solution; all steps are the same for preparing the QD-in-matrix solid.

For LED fabrication, indium tin oxide (ITO) coated glass substrates were cleaned using deionized water, acetone, and 2-propanol sequentially by ultrasonic cleaners and dried. Poly(3,4-ethylenedioxythiophene):poly(styrenesulfonate) (PEDOT:PSS) solution was mixed with a perfluorinated ionomer (PFI) solution at a mass ratio of 1:0.99 under continuous stirring for 1 h. Filtered (by 0.45 μm polyvinylidene difluoride filters) PEDOT:PSS:PFI solution was spin-coated onto the 0-plasma treated ITO substrate following a two-step recipe (500 rpm for 10 s followed by 4500 rpm for 90 s). The PEDOT:PSS:PFI films were baked at 150° C. under ambient condition for 15-30 min.

Deposition of active layers was conducted in a nitrogen-filled glovebox. QD-in-matrix and matrix-only films were coated following the above-mentioned recipe. Before depositing QD-only films, polyvinylcarbazole (PVK) (4 mg/mL in chlorobenzene) was spin-coated on to PEDOT:PSS:PFI substrate (3000 rpm for 30 s), followed by annealing at 125° C. for 15 min. Then a 10 mg/mL PEABr solution was deposited onto PVK (4000 rpm for 30 s), immediately follow by deposition of QD solution (3000 rpm 30 s). The as-prepared QD films were annealed under 80° C. for 5 min.

Then 40 nm of 2,2',2"-(1,3,5-benzinetriyl)-tris(1-phenyl-1-H-benzimidazole) (TPBi), 1 nm of LiF and 90 nm of Al were deposited onto the active layers in a thermal evaporating chamber under a high vacuum ($<10^{-7}$ Torr). All the devices were encapsulated by Scotch tapes.

Results and Discussion

With the goal of modulating $E_g$ of the perovskite, the initial investigations employed Sr as the dopant due to its close match in ionic radius with that of $Pb^{2+}$ and $Cs^+$, in order to minimize lattice mismatch.

Figure 6:
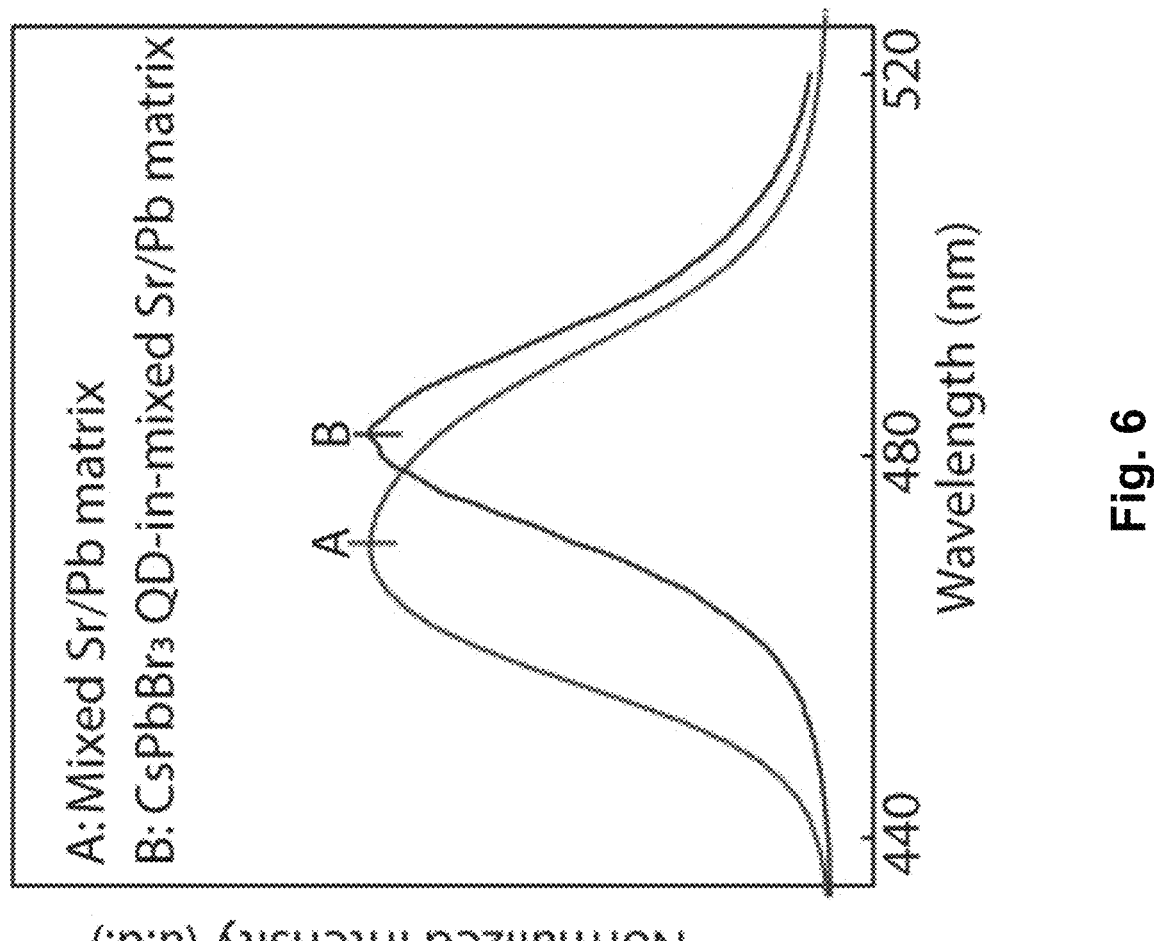
FIG. 6 depicts the photoluminescence (PL) spectra of mixed Sr/Pb matrix and QD-in-mixed Sr/Pb matrix under $N_2$, in accordance with one embodiment of the present invention.
Figure 7:
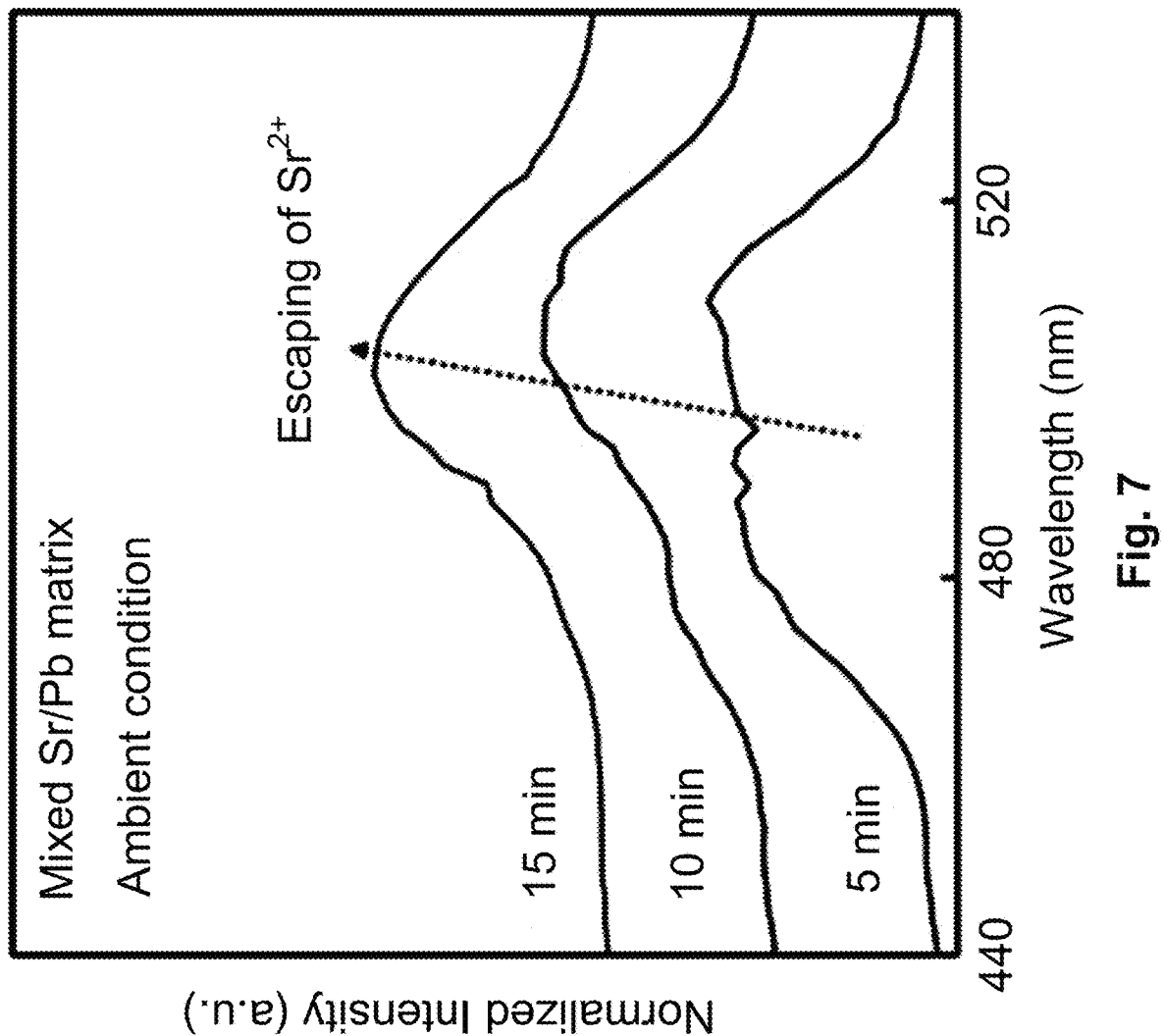
FIG. 7 depicts the PL spectra tracking of a pristine mixed Sr/Pb perovskite matrix under ambient condition, in accordance with one embodiment of the present invention.

When perovskite films containing Sr as a dopant were made, it was observed that these became wet immediately in air and were easily wiped away. This was accompanied by shifts in the PL spectra of films from blue to green. FIG. 6 is the PL spectra of mixed Sr/Pb matrix and QD-in-mixed Sr/Pb matrix under $N_2$, and FIG. 7 is the PL spectra tracking a pristine mixed Sr/Pb perovskite matrix under ambient conditions over time. The mixed Sr/Pb matrix prepared and tested has the formula $Cs_{0.8}MA_{0.2}Pb_{0.6}Sr_{0.4}Br_3$.

Figure 8:
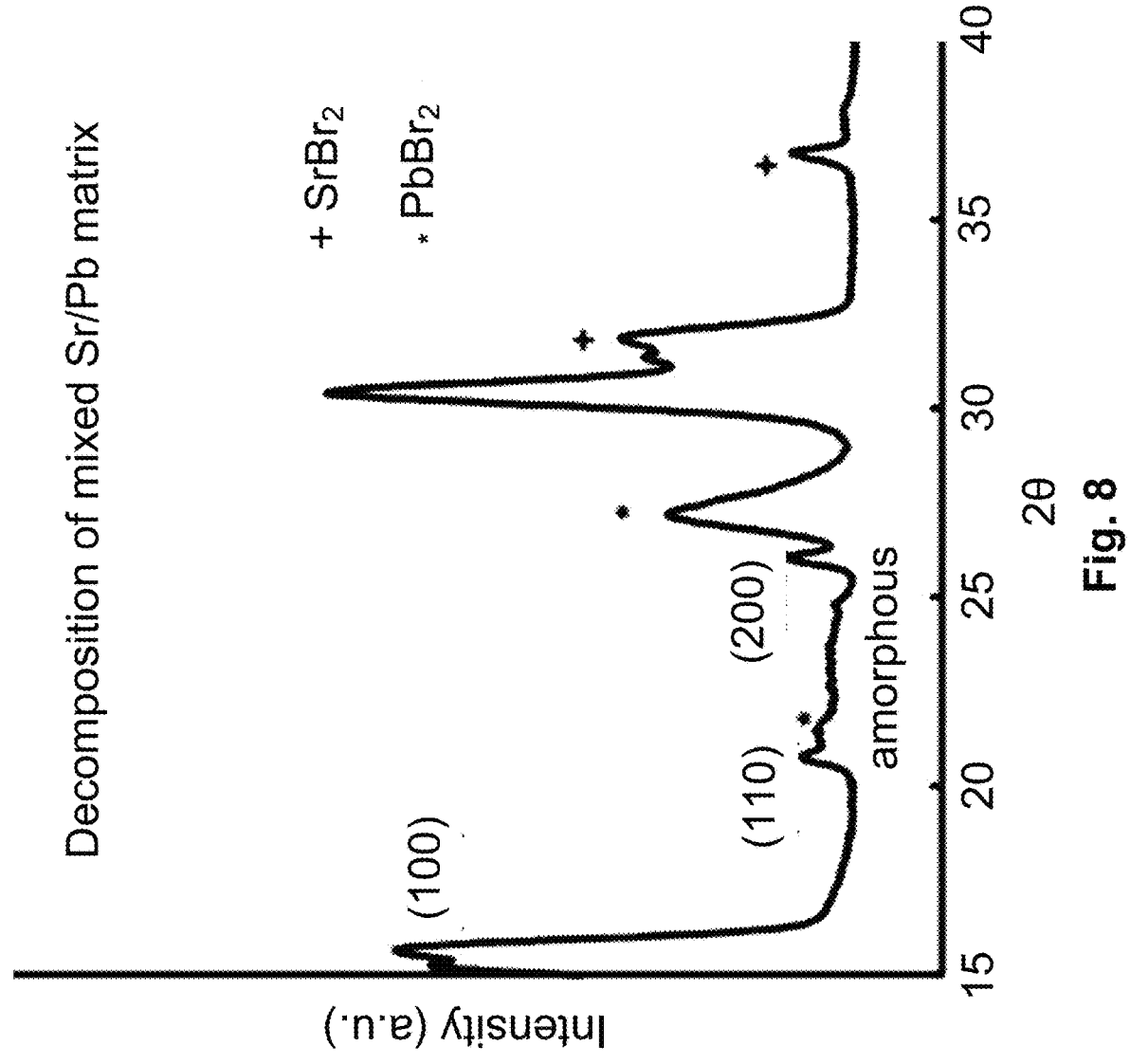
FIG. 8 depicts an X-ray diffraction (XRD) pattern of a mixed Sr/Pb matrix when stored under ambient condition, in accordance with one embodiment of the present invention.

X-ray diffraction (XRD) patterns of pristine (no passivation) mixed Sr/Pb perovskite revealed a decomposed film containing precursor residue, an observation that was attributed to dissociation $[Sr(H_2O)_6]$. FIG. 8 is the XRD pattern of the mixed Sr/Pb matrix when stored under ambient conditions.

As expected, $Sr^{2+}$ alloyed perovskite was observed to be hygroscopic, prone to form $Sr(H_2O)_x^{2+}$ in the presence of moisture (FIG. 5) (Refs 18, 19). $[SrBr_6]^{4-}$ octahedron reacts with $H_2O$ and the $Sr^{2+}$ is extracted from the lattice to form $Sr(H_2O)_x^{2+}$. FIG. 5 is a schematic depiction of the dissolution of $Sr^{2+}$ as a result of $H_2O$ coordination.

Figure 10:
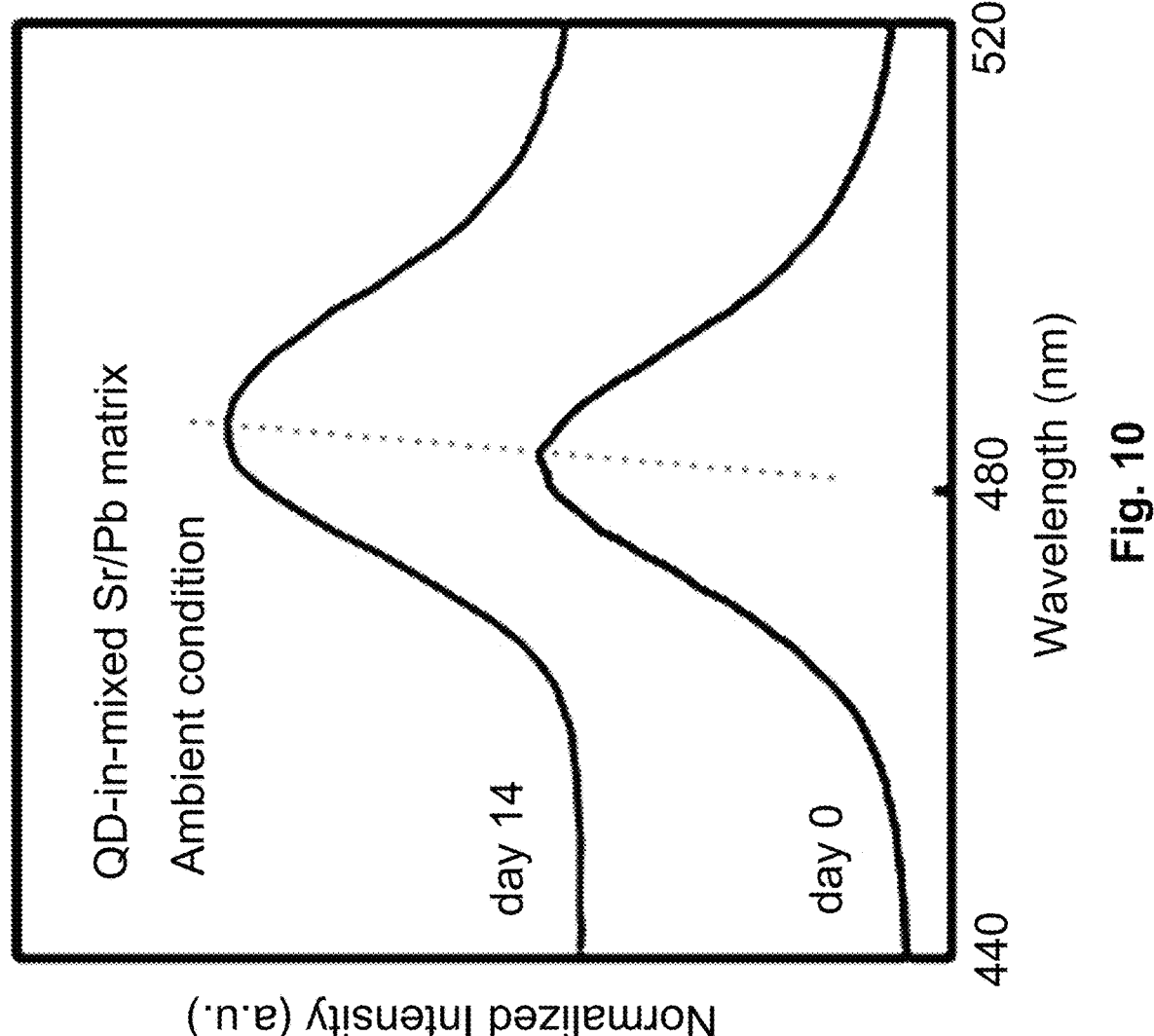
FIG. 10 depicts the PL spectra tracking over 14 days of DFPPO-passivated QD-in-mixed solid stored under ambient condition, in accordance with one embodiment of the present invention.
Figure 11:
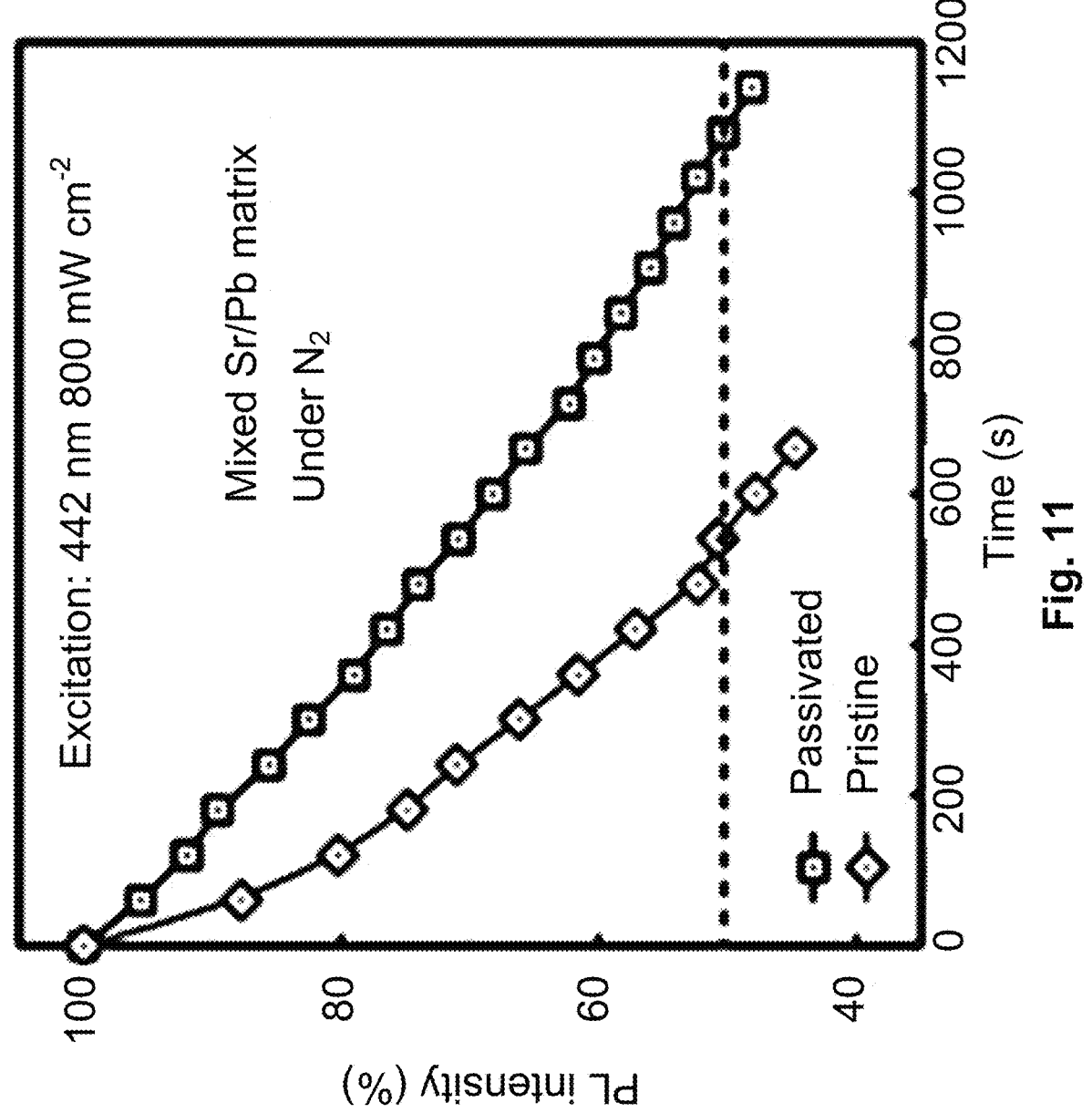
FIG. 11 depicts the PL spectra tracking under intense excitation (442 nm CW laser 800 mW $cm^{-2}$) of pristine and DFPPO-passivated mixed Sr/Pb matrix, in accordance with one embodiment of the present invention.
Figure 12:
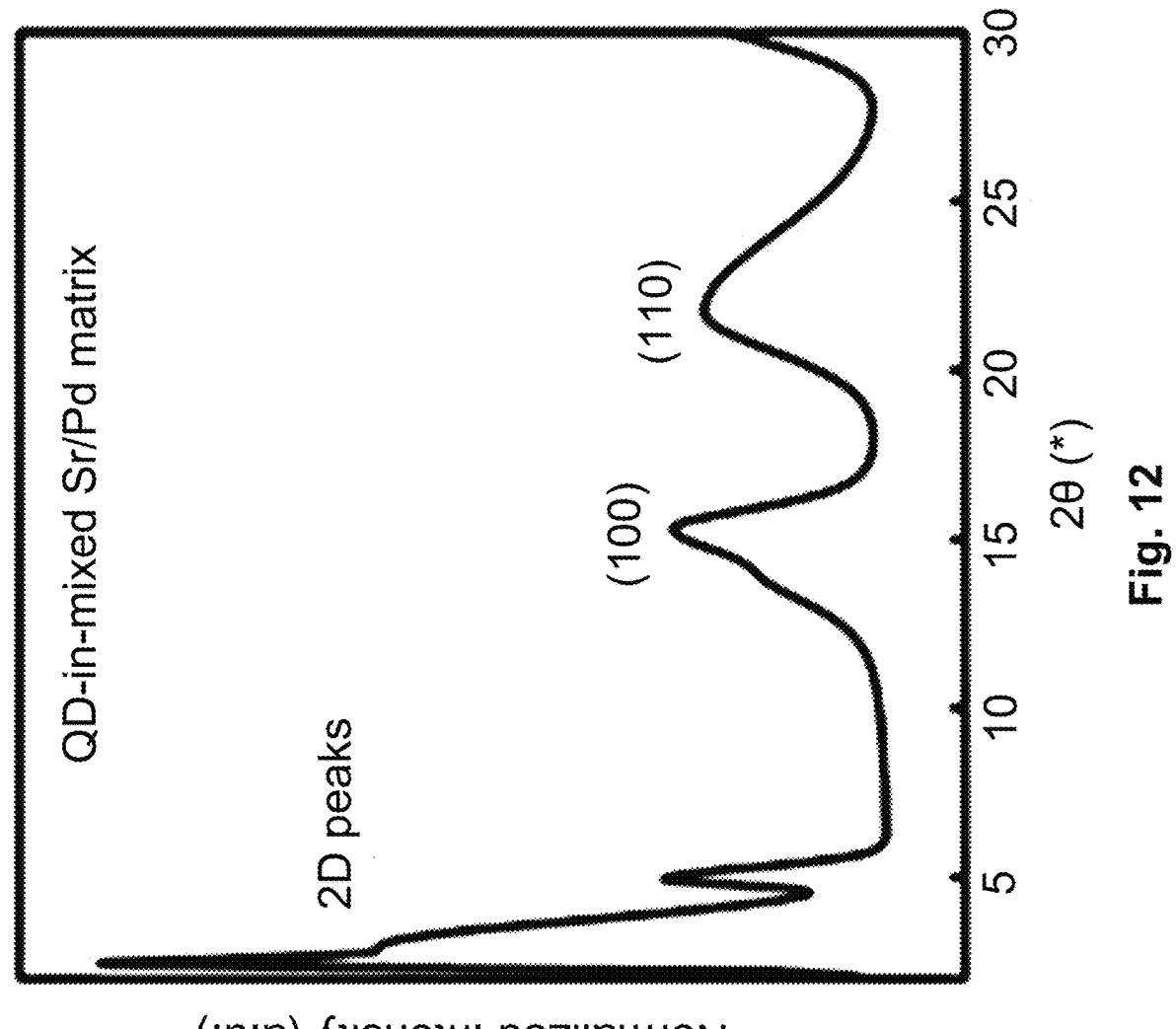
FIG. 12 depicts the XRD pattern of QD-in-mixed Sr/Pb matrix, in accordance with one embodiment of the present invention.

Experimentally, it was found that passivating provided materials having stable emission at 482 nm. When passivated films are stored under ambient conditions over 14 days, the PL shift is less than 5 nm. FIG. 10 depicts the PL spectra tracking over 14 days of DFPPO-passivated QD-inmixed solid stored under ambient conditions. The stability of these materials was studied under intense excitation (442 nm CW laser 800 mW cm$^{-2}$, measured under N$_2$), comparing with unpassivated controls. FIG. 11 depicts the PL spectra tracking of pristine and DFPPO-passivated mixed Sr/Pb matrix under intense excitation conditions. XRD showed that the perovskite was retained, and no evidence of precursor peaks arose, following extended exposure to these high intensities. FIG. 12 depicts the XRD pattern of QD-in-mixed mixed Sr/Pb matrix.

Figure 3B:
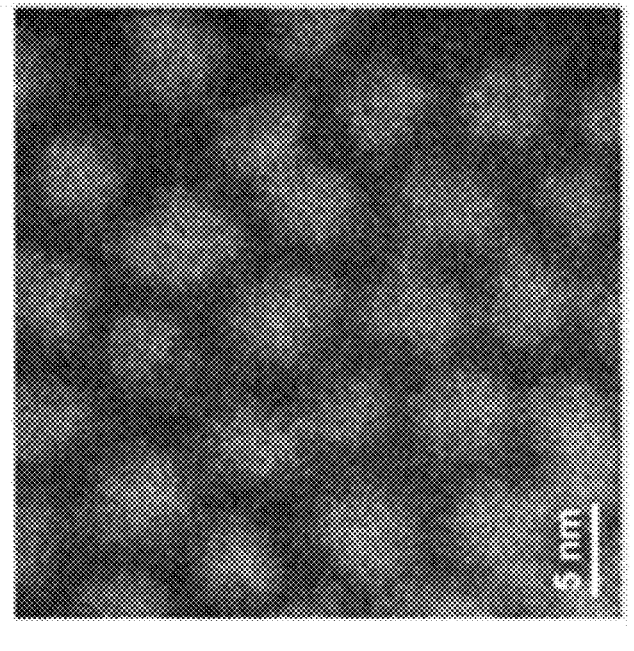
FIG. 3B is an HRTEM of a QD-in-matrix material, in accordance with one embodiment of the present invention.
Figure 3A:
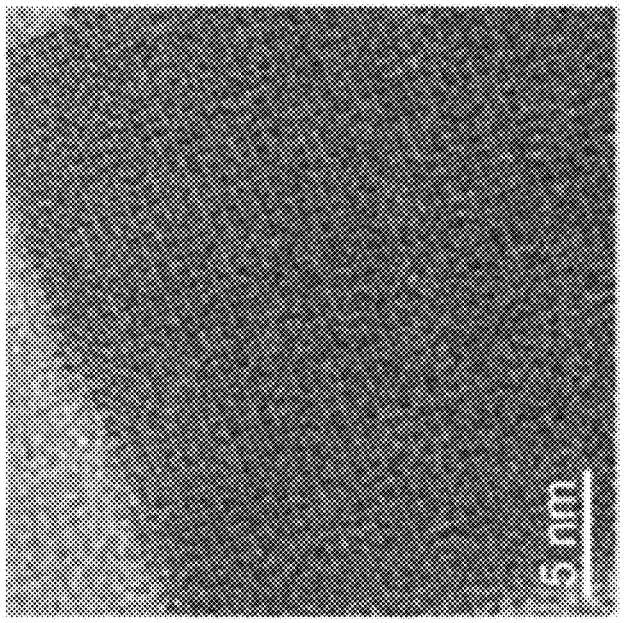
FIG. 3A is a high-resolution transmission electron microscopy (HRTEM) image of a matrix only material.

To study the morphology of the present QD-in-matrix materials, high-resolution transmission electron microscopy (HRTEM) was carried out. The QDs have diameter ~4.2 nm and are surrounded by perovskite matrix, FIG. 3B is a HRTEM image of QD-in-mixed Sr/Pb matrix. The matrix-only perovskite is shown in FIG. 3A.

Figures 13A, 13B:
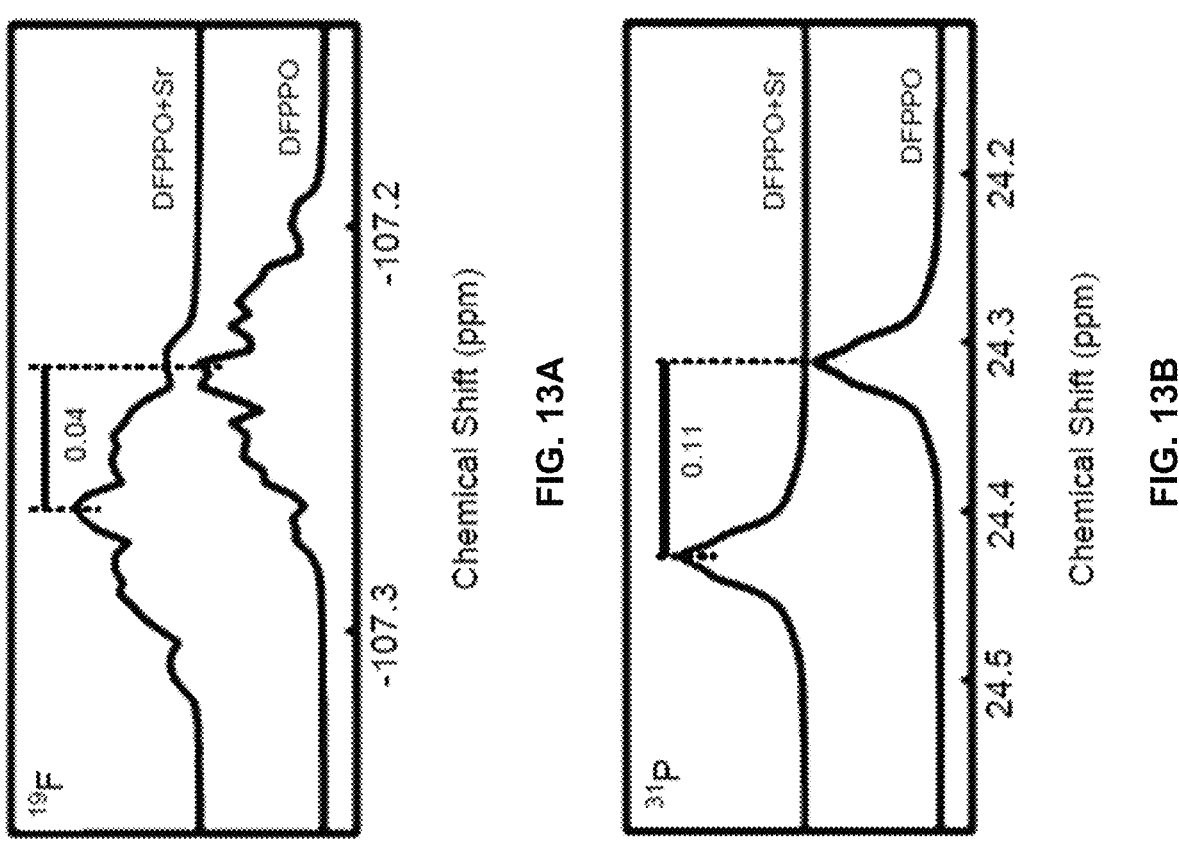
FIG. 13A depicts the $^{19}F$ NMR spectra of DFPPO-Sr and pristine DFPPO.
FIG. 13B depicts the $^{31}P$ NMR spectra of DFPPO-Sr and pristine DFPPO.

The affinity between DFPPO and Sr$^{2+}$ was assayed by recording $^{31}$P and $^{19}$F nuclear magnetic resonance (NMR) chemical shift (δ) for a DFPPO probe upon binding. δ values increase upon addition of Sr$^{2+}$, in agreement with P=O:Sr$^{2+}$ coordination. FIG. 13A depicts the $^{19}$F NMR spectra of DFPPO-Sr and pristine DFPPO, and FIG. 13B depicts the $^{31}$P NMR spectra of DFPPO-Sr and pristine DFPPO.

Figure 14:
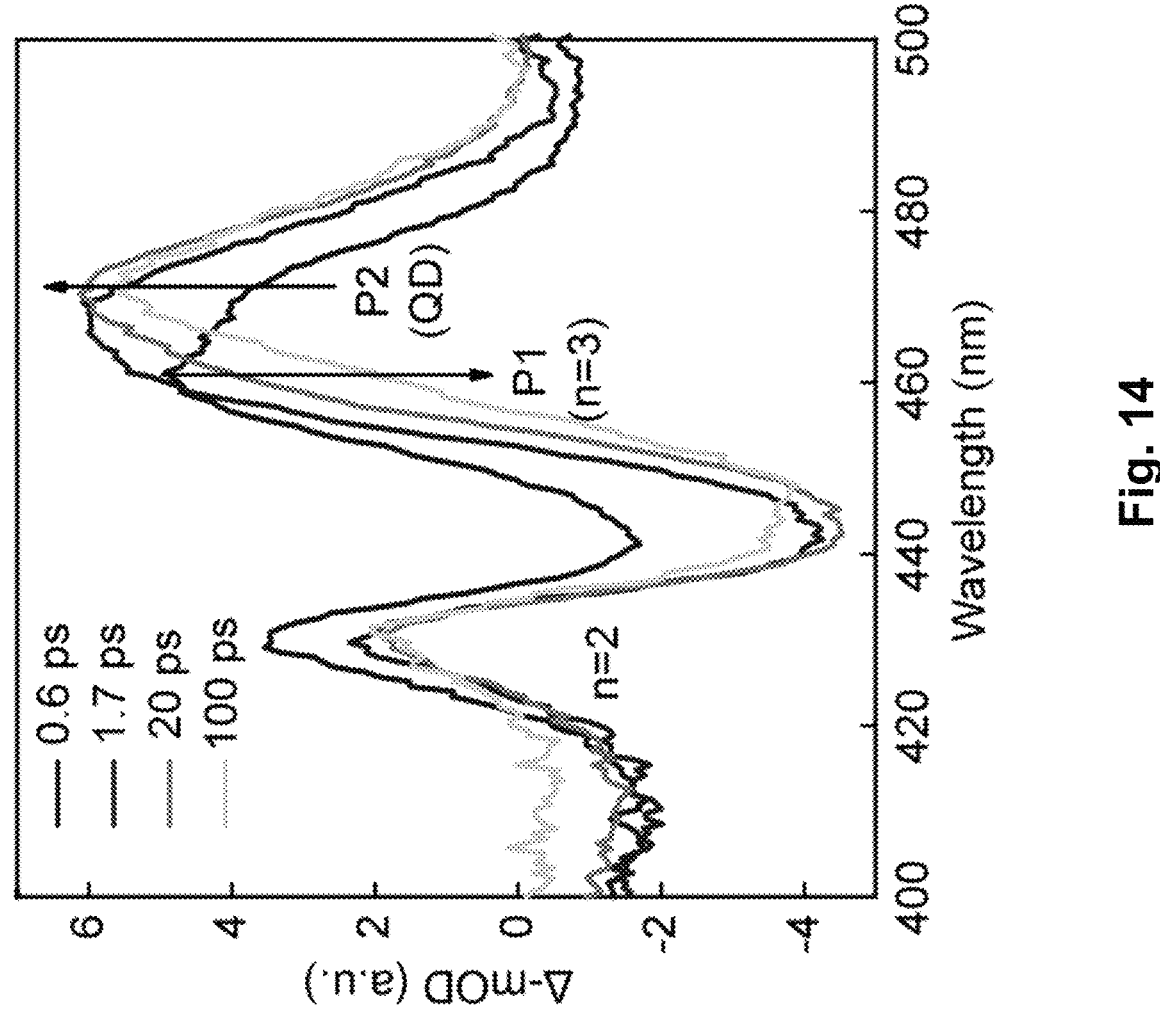
FIG. 14 depicts the transient absorption (TA) spectra of QD-in-mixed Sr/Pb matrix, in accordance with one embodiment of the present invention.
Figure 15:
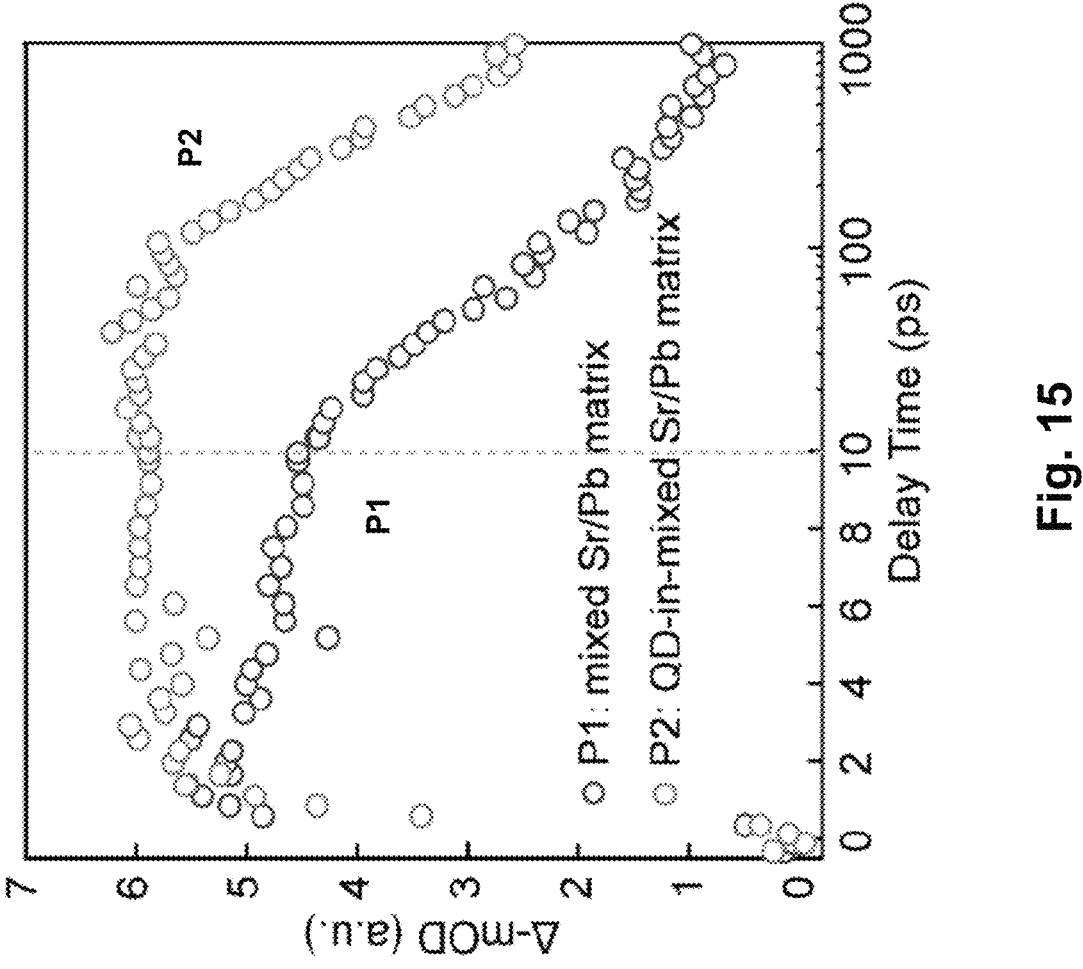
FIG. 15 depicts the kinetic traces of P1 (matrix) and P2 (QD) bleach peaks derived from FIG. 14.
Figure 16:
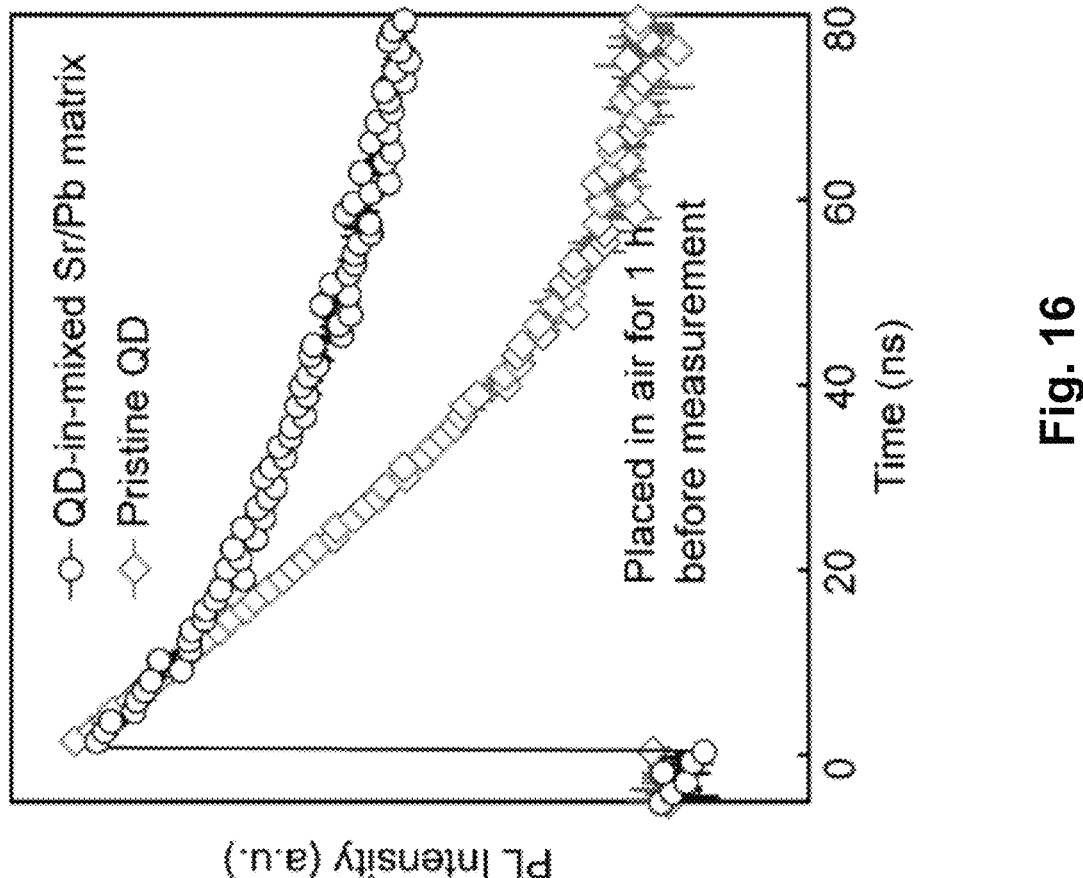
FIG. 16 depicts the PL-lifetime of pristine QDs and QD-in-mixed Sr/Pb matrix, in accordance with one embodiment of the present invention.

To investigate charge transport and surface passivation in QD-in-matrix solids, transient absorption (TA) (FIG. 14) and PL lifetime measurements were measured. Bleach peaks from TA spectra at ~460 nm (P1) and ~472 nm (P2) for QD-in-mixed Sr/Pb matrix samples were observed. These were assigned to the band edge bleach of the matrix (P1) and of the QDs (P2). FIG. 14 depicts the transient absorption (TA) spectra of the QD-in-mixed Sr/Pb matrix. The bleach recovery dynamics of P1 and P2 (FIG. 15) show increasing peak amplitude of P2 (QD) accompanied by fast recovery of P1 (matrix) in the first 4 ps. This agrees with population transfer from P1 to P2. Such a charge transfer process was observed previously in chalcogenide QD-in-perovskite matrix studies[2], where charges funneled through wide-E$_g$ matrix and were injected to low-E$_g$ QDs. The longer bleach recovery time of P2 suggests a high quality QD-matrix interface which is linked to substantially homogeneous crystallization. FIG. 15 depicts the kinetic traces of P1 (matrix) and P2 (QD) bleach peaks derived from FIG. 14. Compared with pristine QDs with bipolar ligand shells, QD-in-matrix solids show longer PL lifetime, again consistent with surface passivation of QDs by the matrix. FIG. 16 depicts the PL-lifetime of pristine QDs and QD-in-mixed Sr/Pb matrix.

Figure 22:
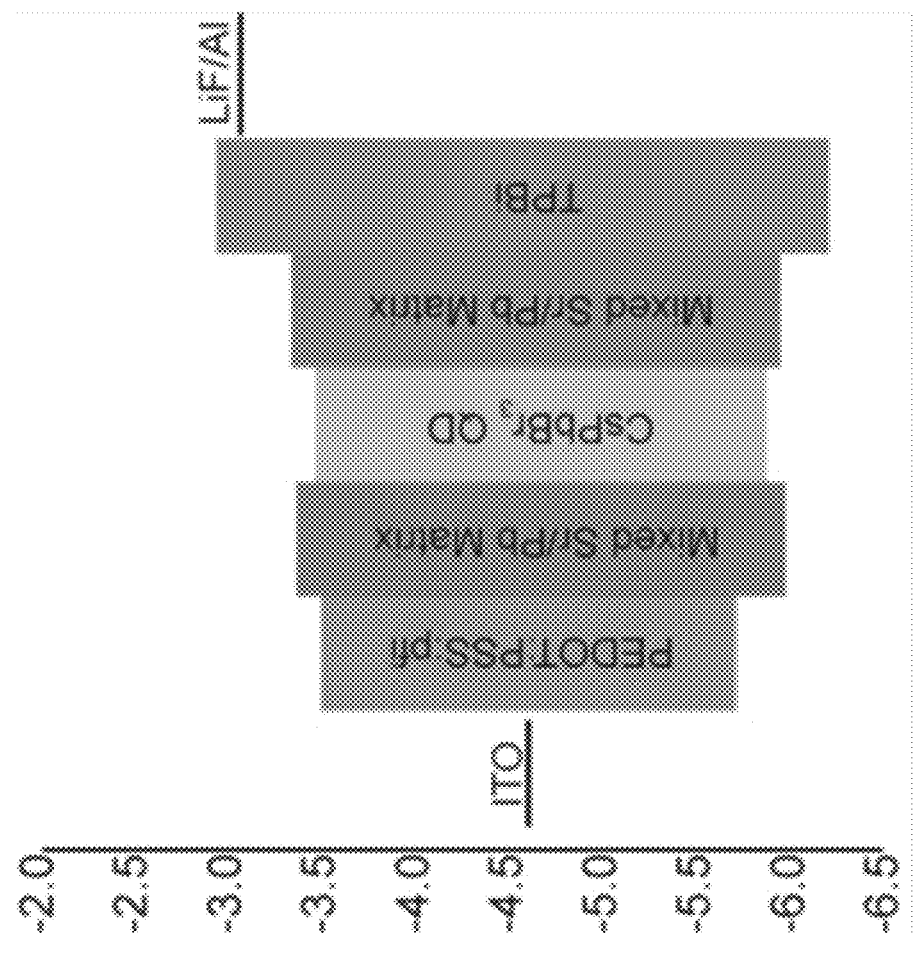
FIG. 22 is a schematic depiction of the structure of an LED device, in accordance with an embodiment of the present invention.
Figure 23:
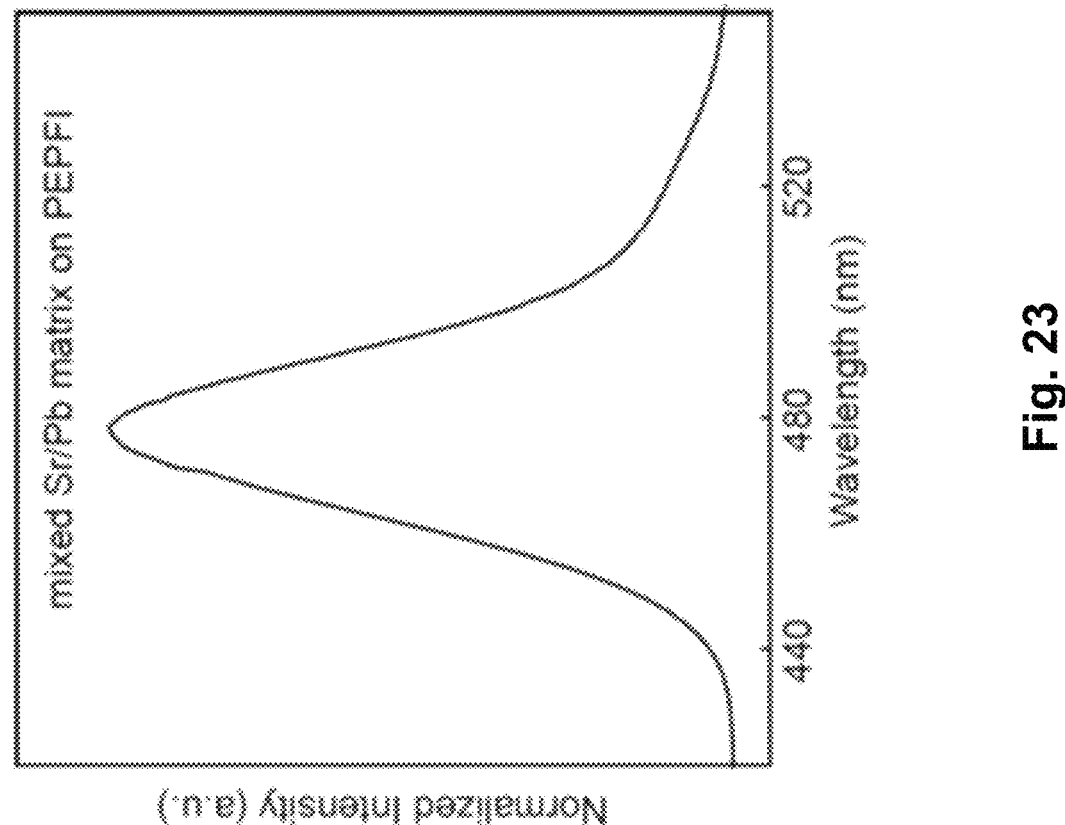
FIG. 23 depicts the redshifted emission wavelength of a QD-in-matrix film coated on PEPFI.

LEDs were then fabricated based on the new QD-in-matrix material, using an ITO/PEDOT:PSS:pfi(PEPFI)/QD-in-matrix/TPBi/LiF/Al device structure (as schematically depicted in FIG. 22). PEPFI is chosen as HTL considering its hole-injection capability and polar solvent compatibility. An undesired PL redshift from 465 nm to 478 nm arose when the films were processed onto PEPFI (FIG. 23), a finding that was attributed to the surface ionic nature of PEPFI (Refs 8, 37). In order to maintain type-I band alignment, the synthesis of the QDs was revised to shift their emission to >485 nm to overcome this issue.

Figures 17A, 17B:
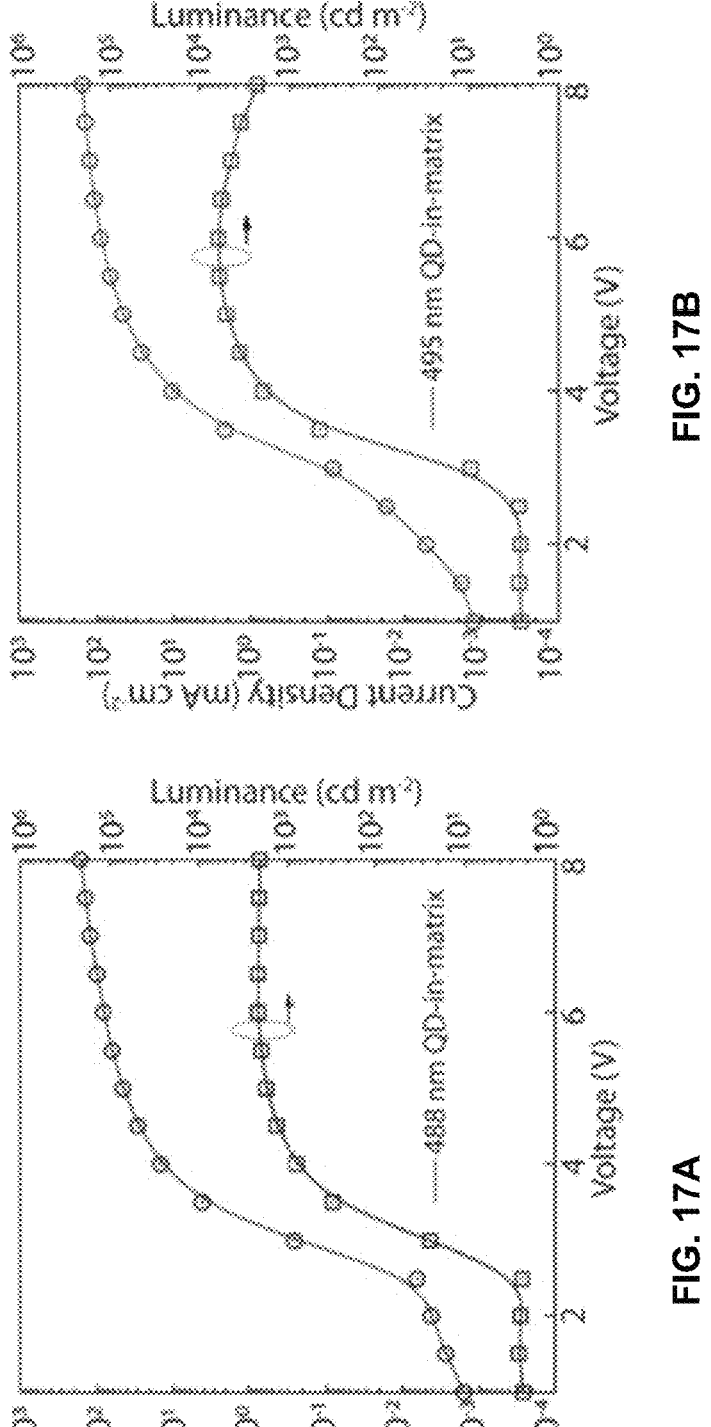
FIGS. 17A and 17B depict representative luminance (squares) and current density (circles) performance versus applied bias derived from QD-in-mixed Sr/Pb matrix LEDs, in accordance with embodiments of the present invention.
Figures 19A, 19B:
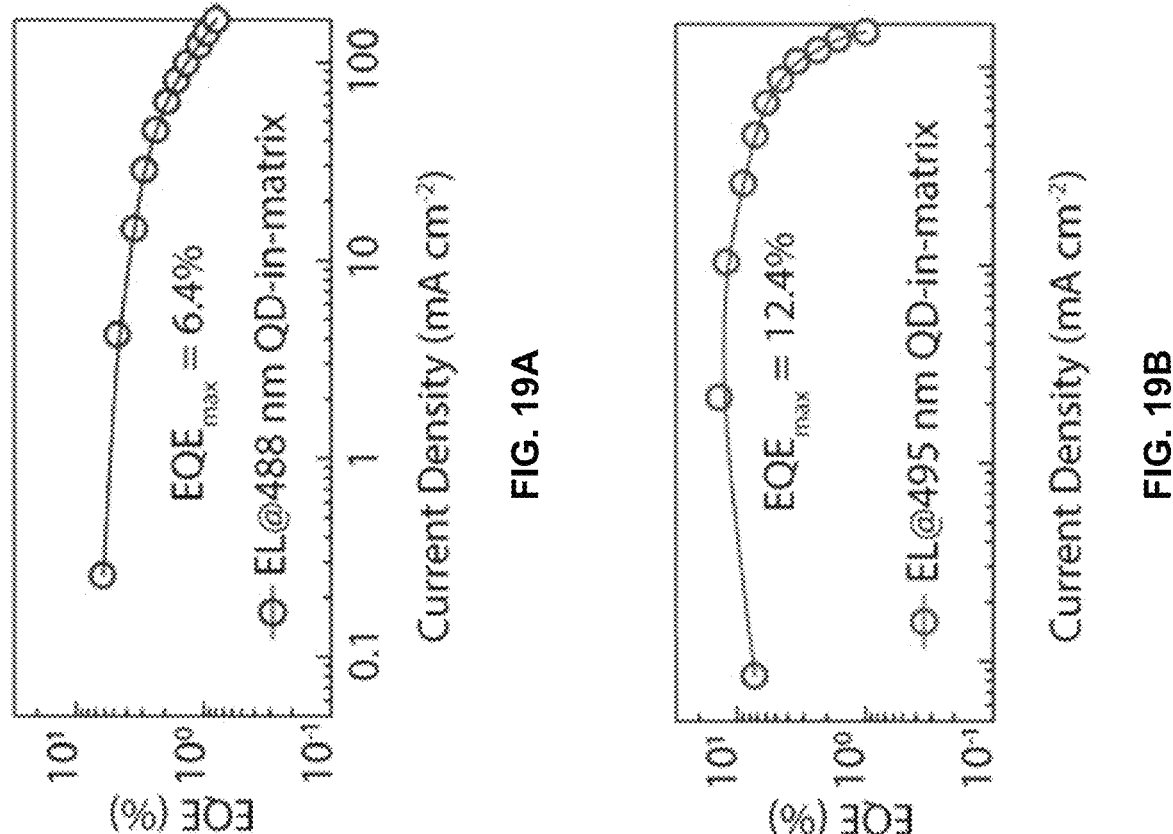
FIGS. 19A and 19B depict EQE as a function of current density for devices from FIGS. 17A and 17B, in accordance with one embodiment of the present invention.
Figure 20:
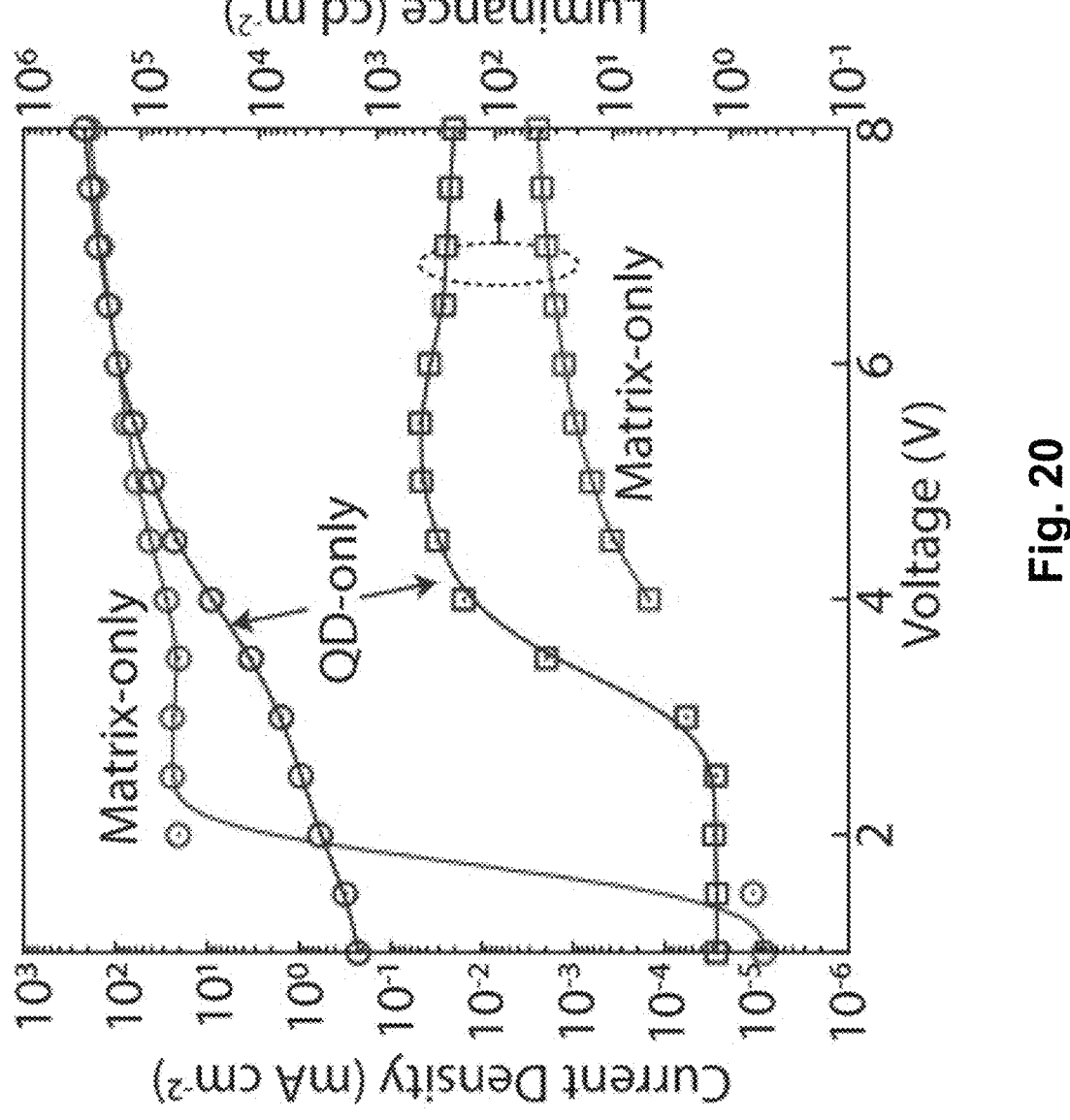
FIG. 20 depicts luminance (squares) and current density (circles) performance versus applied bias for LED devices derived from matrix only (no QDs) and QDs only (no matrix).

FIGS. 17A and 17B show the representative luminance (squares) and current density (circles) performance versus applied bias derived from QD-in-mixed Sr/Pb matrix LEDs. FIGS. 19A and 19B show EQE as a function of current density for the devices from FIGS. 17A and 17B, respectively. Devices based on smaller-diameter dots exhibited an EL maximum at 488 nm, a maximum luminance of ~2160 cd m$^{-2}$ (FIG. 17A, squares), and a highest EQE of 6.4% (FIG. 19A). Devices with larger dots showed 495 nm EL, maximum luminance 6000 cd m$^{-2}$ (FIG. 17B, squares), and highest EQE 12.4% (FIG. 19B). In comparison, QD-only devices (FIG. 20) show a luminance of 500 cd m$^{-2}$. FIG. 20 depicts luminance (squares) and current density (circles) performance versus applied bias for LED devices derived from matrix only (no QDs) and QDs only (no matrix).

Figure 18:
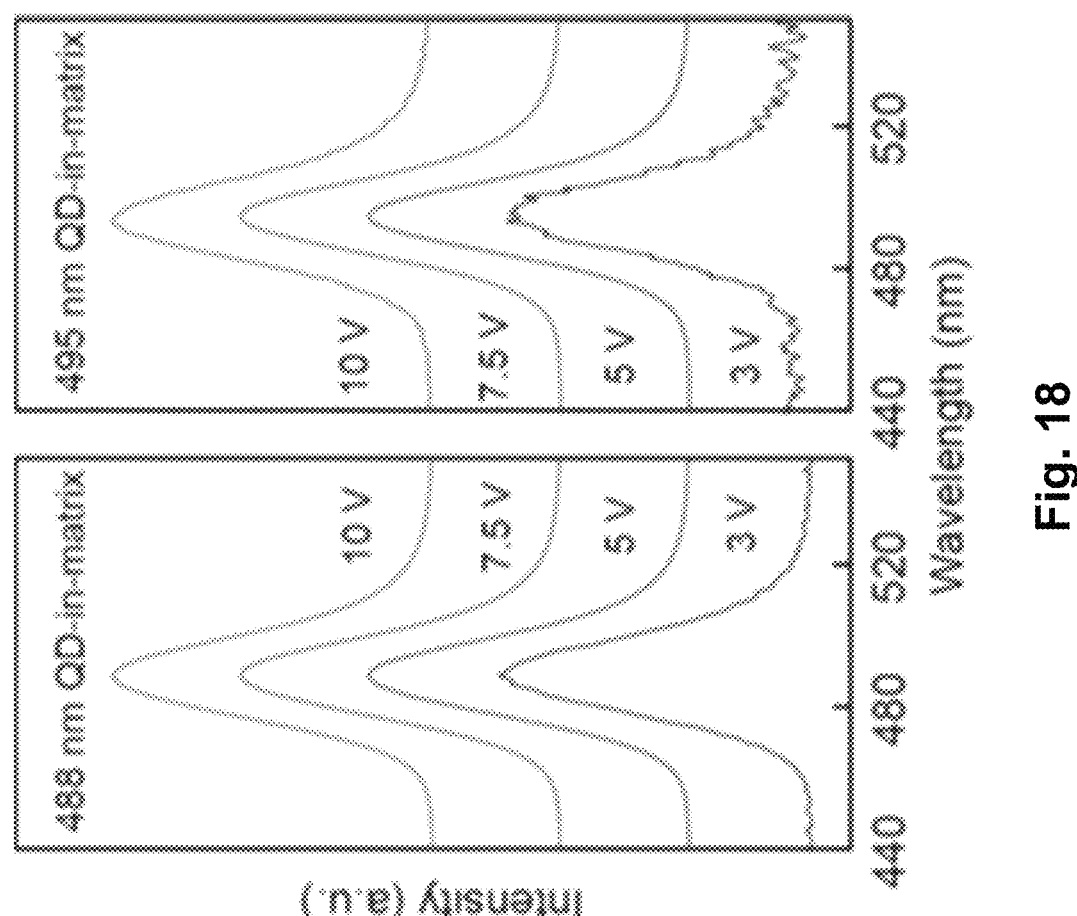
FIG. 18 depicts the emission wavelengths over a range of voltages of QD-in-matrix LEDs, in accordance with embodiments of the present invention.
Figure 21:
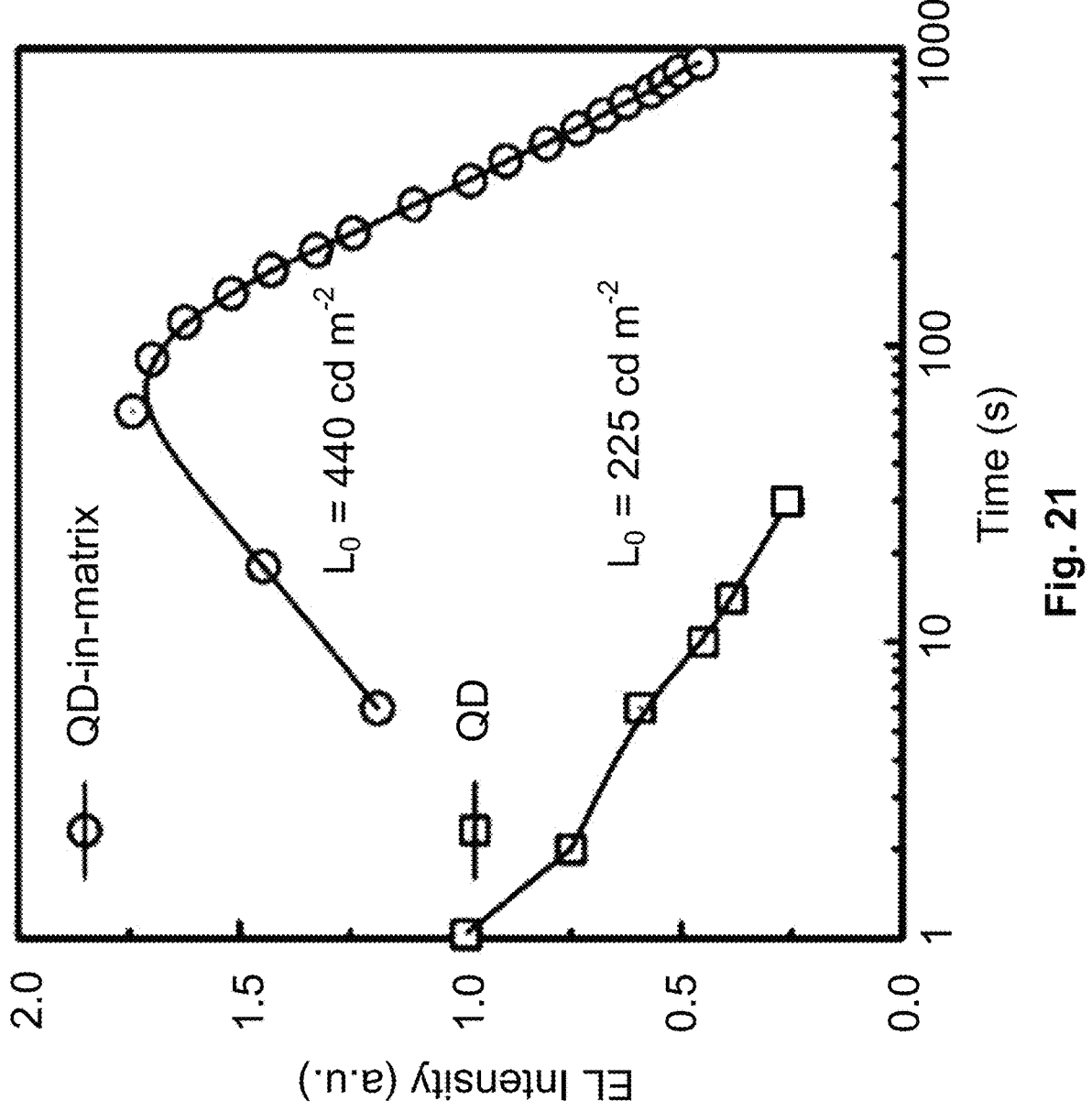
FIG. 21 depicts the electroluminescence (EL) stability tracking of QD-only devices and QD-in-mixed Sr/Pb matrix devices, in accordance with one embodiment of the present invention.
Figure 24:
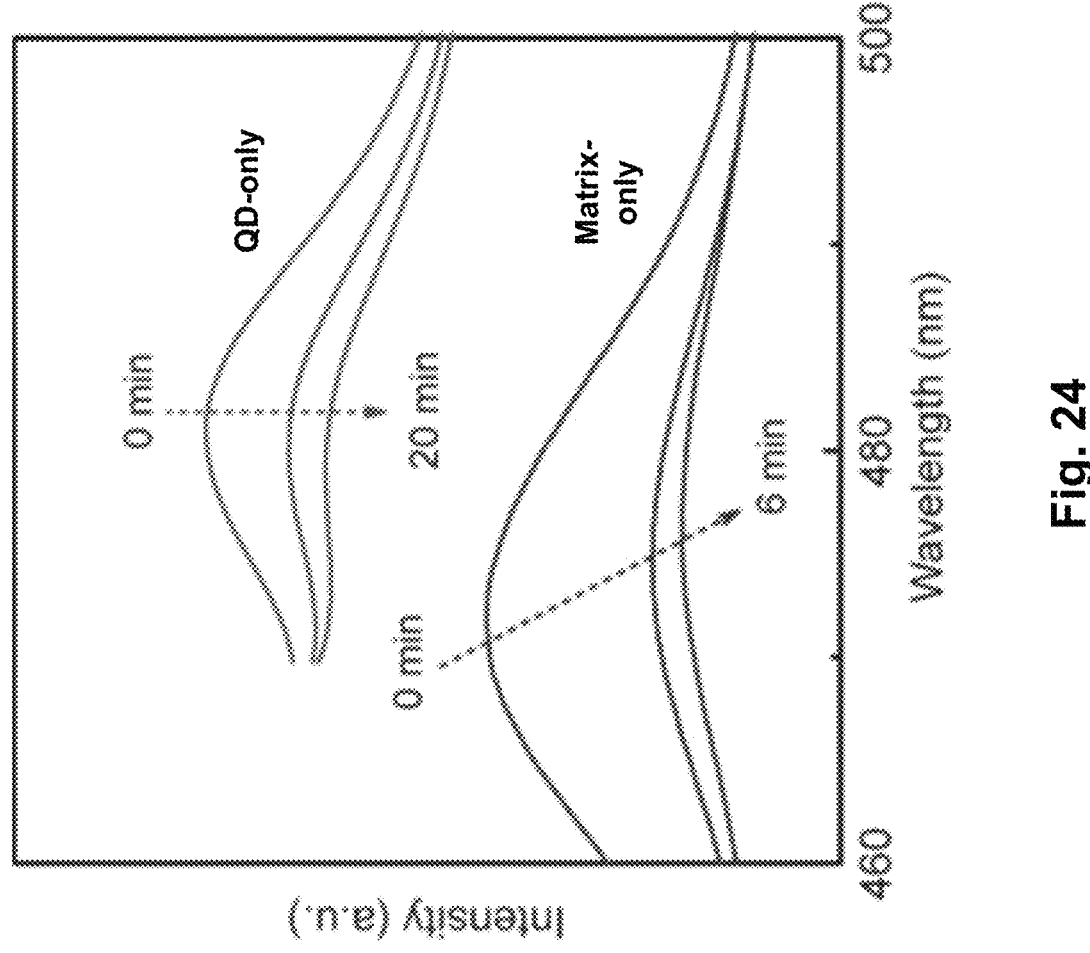
FIG. 24 depicts the decay in PL intensity, in ambient conditions, of QD-only and matrix-only samples.
Figure 25:
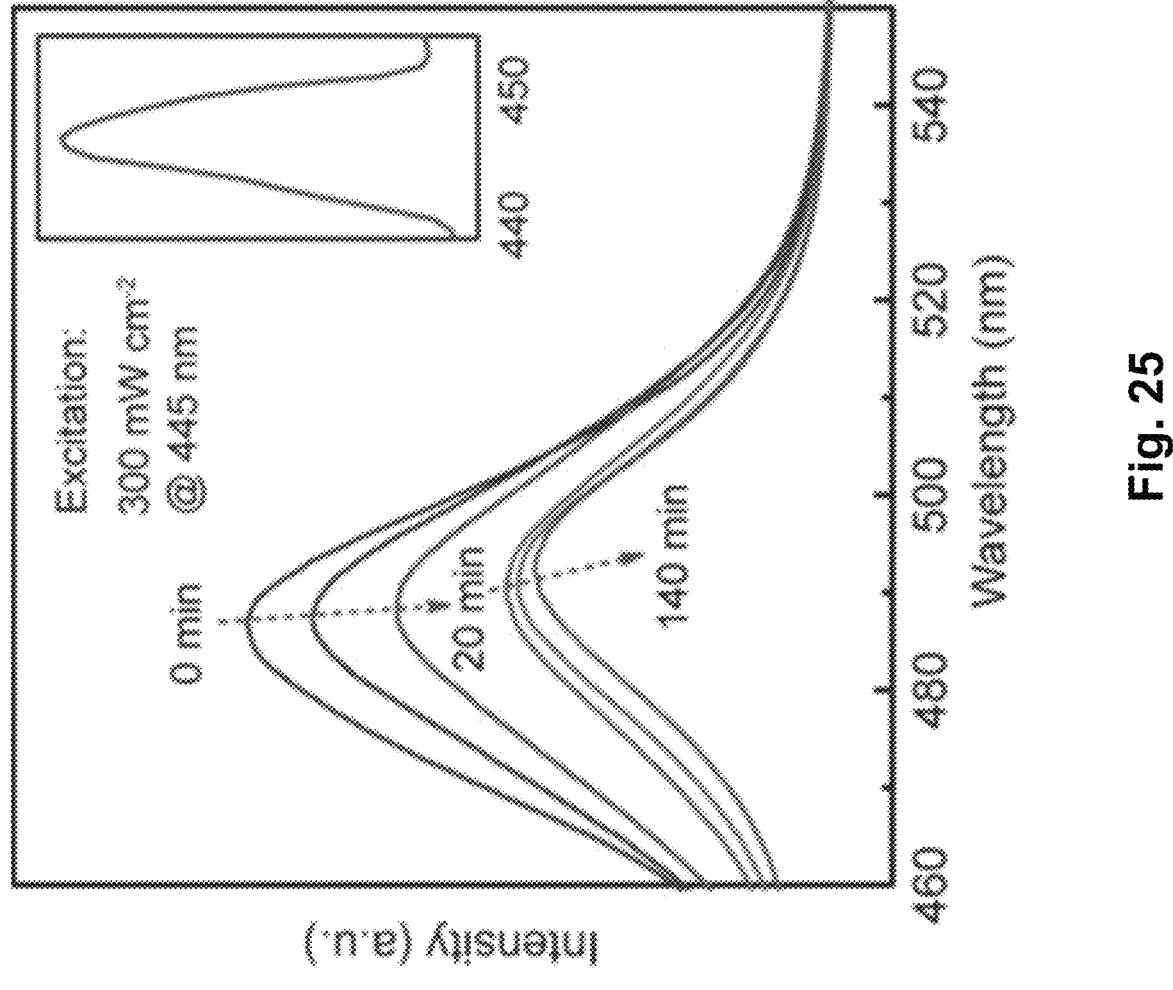
FIG. 25 depicts the resistance to PL shifting, in ambient conditions, over 140 min of a QD-in-matrix material, in accordance with an embodiment of the present invention.
Figure 26:
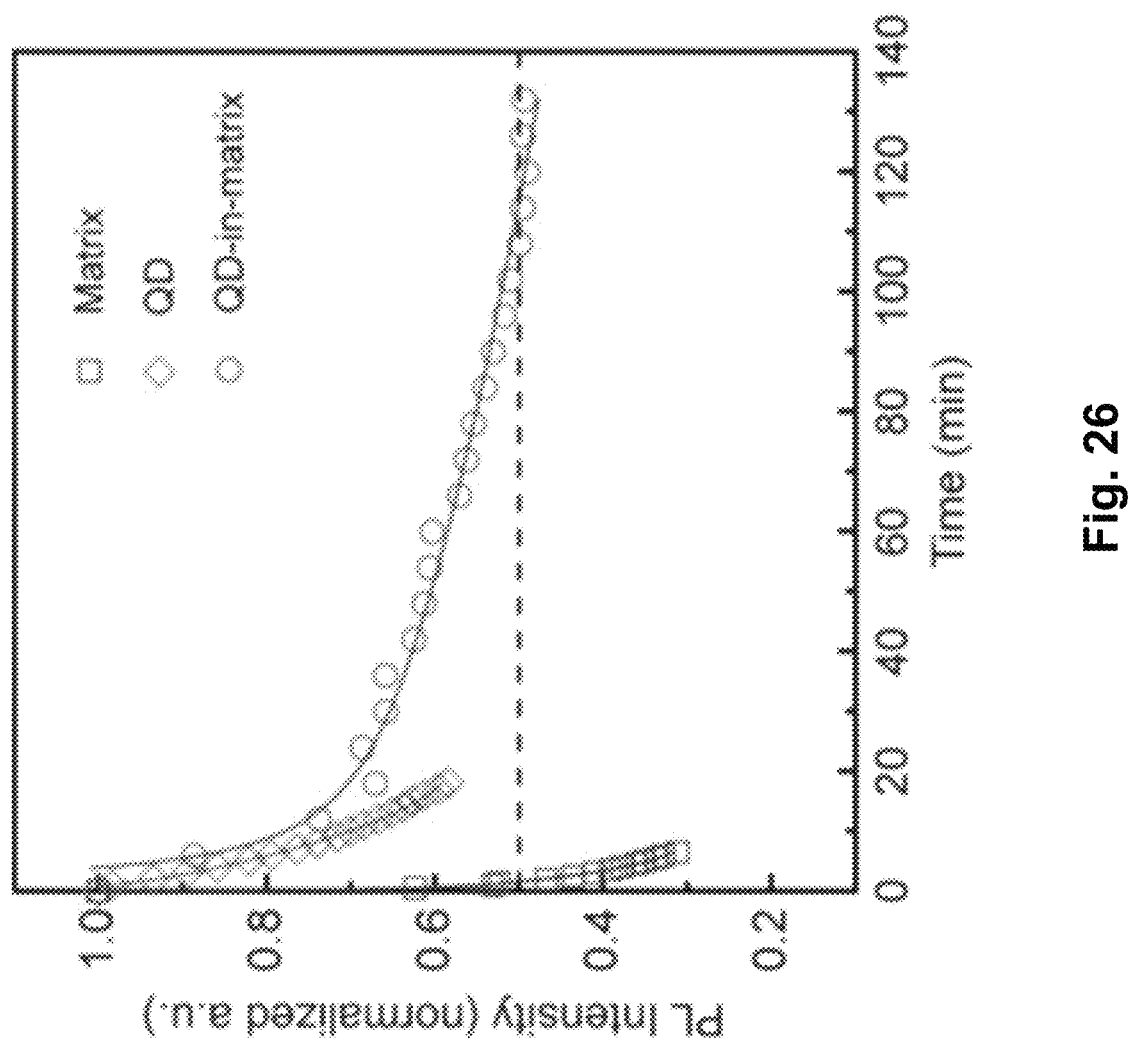
FIG. 26 depicts the resistance to PL intensity degradation, in ambient conditions, of QD-in-matrix solids in accordance with the present invention as compared with pristine QDs and with mixed Sr/Pb matrix only.

The stability of QD-in-matrix solids was studied using PL tracking under intense laser illumination (300 mW cm$^{-2}$ CW laser @442 nm) in ambient conditions. The QD-in-matrix solids are resistant to PL shifting (FIGS. 24 and 25, ~5 nm after T$_{50}$=140 min) compared with pristine QDs and with mixed Sr/Pb perovskite. QD-only and matrix-only samples suffer from rapid decay in PL intensity in the first 6 min and 30 min, respectively (FIG. 24). Additionally, FIG. 26 shows the enhanced stability (LT50 up to +600%) of the QD-in-matrix system (where LT50 is the time necessary to reach the 50% of the initial PL intensity value). Indeed, the latter shows slower PL intensity degradation compared to matrix-only or QDs-only systems. Efficient charge funneling and recombination into the QDs may play a role here, reducing charge accumulation in the matrix perovskite (Ref 38). QD-in-matrix LEDs retain their emission wavelength when the bias was increased to 12 V (FIG. 18) and exhibit enhanced EL stability compared with QD-only devices (matrix-only devices do not reach 100 cd m$^{-2}$ luminance). FIG. 21 shows the EL stability tracking of QD-only and QD-in-mixed Sr/Pb matrix devices, with an initial luminance of 440 cd m$^{-2}$ and 225 cd m$^{-2}$ respectively.

Alloys that modulate E$_g$ of perovskite while simultaneously allowing heteroepitaxy in order to form wide-E$_g$ QD-in-matrix materials were explored. Sr$^{2+}$ implemented a type-I band alignment and lattice matching between QDs and matrix. Passivation of the mixed Sr/Pb perovskite matrix using the bulky DFPPO Lewis base enabled a more stable wide-E$_g$ QD-in-matrix blue emitter. HTLs with desired charge transport and injection will further enhance both stability and performances in QD-in-matrix solids.

It is obvious that the foregoing embodiments of the invention are examples and can be varied in many ways. Such present or future variations are not to be regarded as a departure from the spirit and scope of the invention, and all such modifications as would be obvious to one skilled in the art are intended to be included within the scope of the following claims.

REFERENCES (1) Gao, L.; Quan, L. N.; García de Arquer, F. P.; Zhao, Y.; Munir, R.; Proppe, A.; Quintero-Bermudez, R.; Zou, C.; Yang, Z.; Saidaminov, M. I.; Voznyy, O.; Kinge, S.; Lu, Z.; Kelley, S. O.; Amassian, A.; Tang, J.; Sargent, E. H. Efficient Near-Infrared Light-Emitting Diodes Based on Quantum Dots in Layered Perovskite. *Nat. Photonics* 2020, 14 (4), 227-233.
(2) Ning, Z.; Gong, X.; Comin, R.; Walters, G.; Fan, F.; Voznyy, O.; Yassitepe, E.; Buin, A.; Hoogland, S.; Sargent, E. H. Quantum-Dot-in-Perovskite Solids. *Nature* 2015, 523 (7560), 324-328.
(3) Quintero-Bermudez, R.; Sabatini, R. P.; Lejay, M.; Voznyy, O.; Sargent, E. H. Small-Band-Offset Perovskite Shells Increase Auger Lifetime in Quantum Dot Solids. *ACS Nano* 2017, 11 (12), 12378-12384.
(4) Akkerman, Q. A.; Rainò, G.; Kovalenko, M. V; Manna, L. Lead Halide Perovskite Nanocrystals. *Nat. Mater.* 2018, 17, 394-405.
(5) Protesescu, L.; Yakunin, S.; Bodnarchuk, M. I.; Krieg, F.; Caputo, R.; Hendon, C. H.; Yang, R. X.; Walsh, A.;

Kovalenko, M. V. Nanocrystals of Cesium Lead Halide Perovskites ($CsPbX_3$, X=Cl, Br, and I): Novel Optoelectronic Materials Showing Bright Emission with Wide Color Gamut. *Nano Lett.* 2015, 15 (6), 3692-3696.

(6) Bruno, T. J.; Svoronos, P. D. N. *CRC Handbook of Fundamental Spectroscopic Correlation Charts*; CRC Press, 2005.

(7) Lignos, I.; Protesescu, L.; Emiroglu, D. B.; MacEiczyk, R.; Schneider, S.; Kovalenko, M. V.; DeMello, A. J. Unveiling the Shape Evolution and Halide-Ion-Segregation in Blue-Emitting Formamidinium Lead Halide Perovskite Nanocrystals Using an Automated Microfluidic Platform. *Nano Lett.* 2018, 18 (2), 1246-1252.

(8) Ma, D.; Todorović, P.; Meshkat, S.; Saidaminov, M. I.; Wang, Y.-K. K.; Chen, B.; Li, P.; Scheffel, B.; Quintero-Bermudez, R.; Fan, J. Z.; Dong, Y.; Sun, B.; Xu, C.; Zhou, C.; Hou, Y.; Li, X.; Kang, Y.; Voznyy, 0.; Lu, Z.-H. H.; Ban, D.; Sargent, E. H. Chloride Insertion—Immobilization Enables Bright, Narrowband, and Stable Blue-Emitting Perovskite Diodes. *J. Am. Chem. Soc.* 2020, 142 (11), 5126-5134.

(9) Karlsson, M.; Yi, Z.; Reichert, S.; Luo, X.; Lin, W.; Zhang, Z.; Bao, C.; Zhang, R.; Bai, S.; Zheng, G.; Teng, P.; Duan, L.; Lu, Y.; Zheng, K.; Pullerits, T.; Deibel, C.; Xu, W.; Friend, R.; Gao, F. Mixed Halide Perovskites for Spectrally Stable and High-Efficiency Blue Light-Emitting Diodes. *Nat. Commun.* 2021, 12 (1), 1-10.

(10) Cha, J. H.; Noh, K.; Yin, W.; Lee, Y.; Park, Y.; Ahn, T. K.; Mayoral, A.; Kim, J.; Jung, D. Y.; Terasaki, O. Formation and Encapsulation of All-Inorganic Lead Halide Perovskites at Room Temperature in Metal-Organic Frameworks. *J. Phys. Chem. Lett.* 2019, 10 (9), 2270-2277.

(11) Dong, Y.; Wang, Y.-K.; Yuan, F.; Johnston, A.; Liu, Y.; Ma, D.; Choi, M.-J.; Chen, B.; Chekini, M.; Baek, S.-W.; Sagar, L. K.; Fan, J.; Hou, Y.; Wu, M.; Lee, S.; Sun, B.; Hoogland, S.; Quintero-Bermudez, R.; Ebe, H.; Todorovic, P.; Dinic, F.; Li, P.; Kung, H. T.; Saidaminov, M. I.; Kumacheva, E.; Spiecker, E.; Liao, L.-S.; Voznyy, O.; Lu, Z.-H.; Sargent, E. H. Bipolar-Shell Resurfacing for Blue LEDs Based on Strongly Confined Perovskite Quantum Dots. *Nat. Nanotechnol.* 2020, 15 (8), 668-674.

(12) Pohl, U. W. *Epitaxy of Semiconductors: Introduction to Physical Principles;* 2013.

(13) Liu, J.; Zhang, J. Nanointerface Chemistry: Lattice-Mismatch-Directed Synthesis and Application of Hybrid Nanocrystals. *Chem. Rev.* 2020, 120 (4), 2123-2170.

(14) Peng, X.; Schlamp, M. C.; Kadavanich, A. V.; Alivisatos, A. P. Epitaxial Growth of Highly Luminescent CdSe/CdS Core/Shell Nanocrystals with Photostability and Electronic Accessibility. *J. Am. Chem. Soc.* 1997, 119 (30), 7019-7029.

(15) Cai, L.; Liang, D.; Wang, X.; Zang, J.; Bai, G.; Hong, Z.; Zou, Y.; Song, T.; Sun, B. Efficient and Bright Pure-Blue All-Inorganic Perovskite Light-Emitting Diodes from an Ecofriendly Alloy. *J. Phys. Chem. Lett.* 2021, 12, 1747-1753.

(16) Li, J.; Wang, X.; Tan, Y.; Liang, D.; Zou, Y.; Cai, L.; Wu, T.; Wen, K.; Wang, Y.; Li, Y.; Song, T.; Wang, L.; Sun, B. Strontium Ion B-Site Substitution for Spectral-Stable Blue Emitting Perovskite Light-Emitting Diodes. *Adv. Opt. Mater.* 2020, 8 (23), 2001073.

(17) Shannon, R. D. Revised Effective Ionic Radii and Systematic Studies of Interatomic Distances in Halides and Chalcogenides. *Acta Crystallogr. Sect. A* 1976, 32 (5), 751-767.

(18) Xing, J.; Zhao, Y.; Askerka, M.; Quan, L. N.; Gong, X.; Zhao, W.; Zhao, J.; Tan, H.; Long, G.; Gao, L.; Yang, Z.; Voznyy, O.; Tang, J.; Lu, Z.-H.; Xiong, Q.; Sargent, E. H. Color-Stable Highly Luminescent Sky-Blue Perovskite Light-Emitting Diodes. *Nat. Commun.* 2018, 9 (1), 3541.

(19) Loyd, M.; Lindsey, A.; Patel, M.; Koschan, M.; Melcher, C. L.; Zhuravleva, M. Crystal Structure and Thermal Expansion of $CsCaI_3$:Eu and $CsSrBr_3$:Eu Scintillators. *J. Cryst. Growth* 2018, 481, 35-39.

(20) Mosconi, E.; Azpiroz, J. M.; De Angelis, F. Ab lnitio Molecular Dynamics Simulations of Methylammonium Lead Iodide Perovskite Degradation by Water. *Chem. Mater.* 2015, 27 (13), 4885-4892.

(21) Ma, C.; Shen, D.; Qing, J.; Thachoth Chandran, H.; Lo, M.-F.; Lee, C.-S. Effects of Small Polar Molecules ($MA^+$ and $H_2O$) on Degradation Processes of Perovskite Solar Cells. *ACS Appl. Mater. Interfaces* 2017, 9 (17), 14960-14966.

(22) Cho, J.; Kamat, P. V. Photoinduced Phase Segregation in Mixed Halide Perovskites: Thermodynamic and Kinetic Aspects of Cl—Br Segregation. *Adv. Opt. Mater.* 2020, 2001440.

(23) Zheng, X.; Yuan, S.; Liu, J.; Yin, J.; Yuan, F.; Shen, W. S.; Yao, K.; Wei, M.; Zhou, C.; Song, K.; Zhang, B. Bin; Lin, Y.; Hedhili, M. N.; Wehbe, N.; Han, Y.; Sun, H. T.; Lu, Z. H.; Anthopoulos, T. D.; Mohammed, 0. F.; Sargent, E. H.; Liao, L. S.; Bakr, O. M. Chlorine Vacancy Passivation in Mixed Halide Perovskite Quantum Dots by Organic Pseudohalides Enables Efficient Rec. 2020 Blue Light-Emitting Diodes. *ACS Energy Lett.* 2020, 5 (3), 793-798.

(24) Nenon, D. P.; Pressler, K.; Kang, J.; Koscher, B. A.; Olshansky, J. H.; Osowiecki, W. T.; Koc, M. A.; Wang, L. W.; Alivisatos, A. P. Design Principles for Trap-Free $CsPb_3$ Nanocrystals: Enumerating and Eliminating Surface Halide Vacancies with Softer Lewis Bases. *J. Am. Chem. Soc.* 2018, 140 (50), 17760-17772.

(25) Liu, M.; Zhong, G.; Yin, Y.; Miao, J.; Li, K.; Wang, C.; Xu, X.; Shen, C.; Meng, H. Aluminum-Doped Cesium Lead Bromide Perovskite Nanocrystals with Stable Blue Photoluminescence Used for Display Backlight. *Adv. Sci.* 2017, 4 (11), 1700335.

(26) Thapa, S.; Adhikari, G. C.; Zhu, H.; Grigoriev, A.; Zhu, P. Zn-Alloyed All-Inorganic Halide Perovskite-Based White Light-Emitting Diodes with Superior Color Quality. *Sci. Rep.* 2019, 9 (1), 1-10.

(27) Jiang, Y.; Qin, C.; Cui, M.; He, T.; Liu, K.; Huang, Y.; Luo, M.; Zhang, L.; Xu, H.; Li, S.; Wei, J.; Liu, Z.; Wang, H.; Kim, G. H.; Yuan, M.; Chen, J. Spectra Stable Blue Perovskite Light-Emitting Diodes. *Nat. Commun.* 2019, 10 (1), 1-9.

(28) Cai, T.; Wang, J.; Li, W.; Hills-Kimball, K.; Yang, H.; Nagaoka, Y.; Yuan, Y.; Zia, R.; Chen, O. $Mn^{2+}/Yb^{3+}$ Codoped $CsPbCl_3$ Perovskite Nanocrystals with Triple-Wavelength Emission for Luminescent Solar Concentrators. *Adv. Sci.* 2020, 7 (18), 2001317.

(29) Pan, G.; Bai, X.; Xu, W.; Chen, X.; Zhai, Y.; Zhu, J.; Shao, H.; Ding, N.; Xu, L.; Dong, B.; Mao, Y.; Song, H. Bright Blue Light Emission of $Ni^{2+}$ Ion-Doped $CsPbCl_xBr_{3-x}$ Perovskite Quantum Dots Enabling Efficient Light-Emitting Devices. *ACS Appl. Mater. Interfaces* 2020, 12 (12), 14195-14202.

(30) Chiba, T.; Sato, J.; Ishikawa, S.; Takahashi, Y.; Ebe, H.; Sumikoshi, S.; Ohisa, S.; Kido, J. Neodymium Chloride-Doped Perovskite Nanocrystals for Efficient Blue Light-Emitting Devices. *ACS Appl. Mater. Interfaces* 2020, 12 (48), 53891-53898.

15

(31) Yang, Z.; Jiang, Z.; Liu, X.; Zhou, X.; Zhang, J.; Li, W. Bright Blue Light-Emitting Doped Cesium Bromide Nanocrystals: Alternatives of Lead-Free Perovskite Nanocrystals for White LEDs. *Adv. Opt. Mater.* 2019, 7 (10), 1900108.

(32) Du, K. Z.; Wang, X.; Han, Q.; Yan, Y.; Mitzi, D. B. Heterovalent B-Site Co-Alloying Approach for Halide Perovskite Bandgap Engineering. *ACS Energy Lett.* 2017, 2 (10), 2486-2490.

(33) Adhikari, G. C.; Thapa, S.; Zhu, H.; Zhu, P. Mg2+-Alloyed All-Inorganic Halide Perovskites for White Light-Emitting Diodes by 3D-Printing Method. *Adv. Opt. Mater.*

(34) Kerridge, A.; Kaltsoyannis, N. The Coordination of $Sr^{2+}$ by Hydroxide: A Density Functional Theoretical Study. *Dalt. Trans.* 2011, 40 (42), 11258-11266.

(35) Haake, P.; Cook, R. D.; Hurst, G. H. Evaluation of the Basicity of Phosphine Oxides and Phosphine Sulfides by Measurements of Chemical Shift in Sulfuric Acid Solutions. *J. Am. Chem. Soc.* 1967, 89 (11), 2650-2654.

(36) Cotton, F. A.; Francis, R. Sulfoxides as Ligands. I. A Preliminary Survey of Methyl Sulfoxide Complexes. *J. Am. Chem. Soc.* 1960, 82 (12), 2986-2991.

(37) Xing, J.; Zhao, Y.; Askerka, M.; Quan, L. N.; Gong, X.; Zhao, W.; Zhao, J.; Tan, H.; Long, G.; Gao, L.; Yang, Z.; Voznyy, O.; Tang, J.; Lu, Z.-H.; Xiong, Q.; Sargent, E. H. Color-Stable Highly Luminescent Sky-Blue Perovskite Light-Emitting Diodes. *Nat. Commun.* 2018, 9 (1), 3541.

(38) Draguta, S.; Sharia, O.; Yoon, S. J.; Brennan, M. C.; Morozov, Y. V.; Manser, J. S.; Kamat, P. V.; Schneider, W. F.; Kuno, M. Rationalizing the Light-Induced Phase Separation of Mixed Halide Organic—Inorganic Perovskites. *Nat. Commun.* 2017, 8 (1), 200.

(39) Dong, Y.; Qiao, T.; Kim, D.; Parobek, D.; Rossi, D.; Son, D. H. Precise Control of Quantum Confinement in Cesium Lead Halide Perovskite Quantum Dots via Thermodynamic Equilibrium. *Nano Lett.* 2018, 18 (6), 3716-3722.

(40) Puthenpurayil, J.; Cheng, O. H. C.; Qiao, T.; Rossi, D.; Son, D. H. On the Determination of Absorption Cross Section of Colloidal Lead Halide Perovskite Quantum Dots. *J. Chem. Phys.* 2019, 151 (15), 154706.

We claim:

1. A quantum dot (QD)-in-matrix material for use in blue light emitting diodes, wherein the QD-in-matrix material comprises a plurality of quantum dots embedded in a perovskite matrix, wherein the quantum dots comprise a perovskite having Formula (I):

$$ABX_3 \tag{I}$$

wherein

A is Cs, MA (methylammonium), FA (formamidinium), or any combination thereof;

B is Pb, Sn, or a combination thereof; and

X is Br, Cl, or a combination thereof;

and wherein the perovskite matrix is a doped perovskite having Formula (II):

$$A'B'_{1-x}D_xX'_3 \tag{II}$$

wherein

A' is Cs, MA, FA, or any combination thereof;

B' is Pb, Sn, or a combination thereof;

X' is Br;

D is Sr, Ca, Ba, Eu, Zn, Cd, Hf, Ti, Se, Zr, or Mn; and x is a value between 0.05 and 0.5,

wherein the material further comprises an organic passivant, wherein the organic passivant is bis(4-fluorophenyl)phenyl phosphine oxide (DFPPO).

2. An electroluminescent device comprising a QD-in-matrix material as defined in claim 1.

3. The electroluminescent device of claim 2, wherein the electroluminescent device is an LED device.

4. A quantum dot (QD)-in-matrix material for use in blue light emitting diodes, wherein the QD-in-matrix material comprises a plurality of quantum dots embedded in a perovskite matrix, wherein the quantum dots comprise a perovskite having Formula (I):

$$ABX_3 \tag{I}$$

wherein A is Cs, B is Pb, and X is Br;

and wherein the perovskite matrix is a doped perovskite having Formula (II):

$$A'B'_{1-x}D_xX'_3 \tag{II}$$

wherein

A' is Cs, MA, FA, or any combination thereof;

B' is Pb;

X' is Br;

D is Sr; and x is 0.4;

and wherein the material further comprises an organic passivant.

5. An electroluminescent device comprising a QD-in-matrix material as defined in claim 4.

6. The electroluminescent device of claim 5, wherein the electroluminescent device is an LED device.

7. A quantum dot (QD)-in-matrix material for use in blue light emitting diodes, wherein the QD-in-matrix material comprises a plurality of quantum dots embedded in a perovskite matrix, wherein the quantum dots comprise a perovskite having Formula (I):

$$ABX_3 \tag{I}$$

wherein A is Cs, B is Pb, and X is Br;

and wherein the perovskite matrix is a doped perovskite having Formula (II):

$$A'B'_{1-x}D_xX'_3 \tag{II}$$

A' is $Cs_{0.8}MA_{0.2}$;

B' is Pb;

X' is Br;

D is Sr; and x is 0.4;

and wherein the material further comprises an organic passivant.

8. The material of claim 7, wherein the passivant is bis(4-fluorophenyl)phenyl phosphine oxide DFPPO.

9. An electroluminescent device comprising a QD-in-matrix material as defined in claim 8.

10. The electroluminescent device of claim 9, wherein the electroluminescent device is an LED device.

11. An electroluminescent device comprising a QD-in-matrix material as defined in claim 7.

12. The electroluminescent device of claim 11, wherein the electroluminescent device is an LED device.

* * * * *